(12) United States Patent
Pan et al.

(10) Patent No.: US 9,817,058 B2
(45) Date of Patent: Nov. 14, 2017

(54) ADDRESSABLE TEST CIRCUIT AND TEST METHOD FOR KEY PARAMETERS OF TRANSISTORS

(71) Applicant: Semitronix Corporation, Hangzhou (CN)

(72) Inventors: Weiwei Pan, Hangzhou (CN); Yongjun Zheng, Hangzhou (CN)

(73) Assignee: Semitronix Corporation, Hangzhou (CN)

( * ) Notice: Subject to any disclaimer, the term of this patent is extended or adjusted under 35 U.S.C. 154(b) by 0 days.

(21) Appl. No.: 15/351,421

(22) Filed: Nov. 14, 2016

(65) Prior Publication Data

US 2017/0059645 A1  Mar. 2, 2017

Related U.S. Application Data

(63) Continuation-in-part of application No. 14/523,927, filed on Oct. 26, 2014, now abandoned, which is a (Continued)

(30) Foreign Application Priority Data

Nov. 28, 2012 (CN) .......................... 2012 1 0492931

(51) Int. Cl.
| | |
|---|---|
| *G01R 31/26* | (2014.01) |
| *H01L 21/66* | (2006.01) |
| *G11C 29/50* | (2006.01) |

(52) U.S. Cl.
CPC ..... *G01R 31/2621* (2013.01); *G01R 31/2601* (2013.01); *G01R 31/2607* (2013.01);

(Continued)

(58) Field of Classification Search
CPC ........... G09G 3/006; G09G 2300/0426; G09G 2330/12; H01L 22/34; G01R 31/2601; G01R 31/2607; G01R 31/2621; G01R 31/2614; G01R 19/155; G01R 31/2831; G01R 31/2858; G01R 31/2884; G01R 31/316; G01R 31/31701; G01R 31/311; G01R 31/3177; G06F 11/2273; G06F 17/5045; H03K 17/223; H03K 17/14;

(Continued)

(56) References Cited

U.S. PATENT DOCUMENTS

| | | | | |
|---|---|---|---|---|
| 6,693,448 | B1 * | 2/2004 | Okada ................ | G01R 31/3004 324/750.3 |
| 7,560,951 | B2 * | 7/2009 | Agarwal ............ | G01R 31/2884 324/762.08 |

* cited by examiner

*Primary Examiner* — Vinh Nguyen

(74) *Attorney, Agent, or Firm* — Syncoda LLC; Feng Ma; Junjie Feng

(57) ABSTRACT

An addressable test circuit is configured to test parameters of a plurality of transistors. The addressable test circuit includes combination logic circuits including a plurality of gate circuits and are configured to select a device under test, a plurality of PADs, a plurality of address bus and data bus; wherein six or more of the data buses are test signal lines. A test method can employ the above address test circuit for testing parameters of a plurality of transistors, where the subthreshold leakage current $I_{off}$ and saturation current $I_{dsat}$ are measured in different signal lines respectively to ensure the accurate measurement of the two parameters in one circuit.

19 Claims, 18 Drawing Sheets

Related U.S. Application Data continuation of application No. PCT/CN2013/076969, filed on Jun. 8, 2013.

(52) U.S. Cl.
CPC ........ *G11C 29/50008* (2013.01); *H01L 22/34* (2013.01); *G11C 2029/5002* (2013.01); *G11C 2029/5006* (2013.01); *H01L 2924/0002* (2013.01)

(58) Field of Classification Search
CPC ........... H03K 17/567; G01N 33/54366; G01N 33/54386; H02M 3/155; F02B 1/04; F02B 2075/125; H04B 3/54
See application file for complete search history.

ADDRESSABLE TEST CIRCUIT AND TEST METHOD FOR KEY PARAMETERS OF TRANSISTORS

The present application is a continuation-in-part of, and claims priority to, U.S. patent application Ser. No. 14/523,927 filed on Oct. 26, 2014, now abandoned, which in turn is a continuation of, and claims priorities to, PCT Patent Application No. PCT/CN2013/076969 filed on Jun. 8, 2013, which claims priority to Chinese Patent Application No. CN 201210492931.9 filed on Nov. 28, 2012. The disclosures of these applications are hereby incorporated by reference in their entirety.

BACKGROUND

With the development of integrated circuits, the characteristic size of electronic circuit is being significantly reduced, and the circuit performance is vastly improved.

However, the process development reaching nanometer scales also brings many challenges, especially the problems of process volatility. The smaller feature size requires a smaller margin of process volatility during the manufacturing process. This can lead to greater instability of process parameters, such as random fluctuations of temperatures, doping concentrations, etc. Lithography, chemical mechanical polishing (CMP), etc. can all cause fluctuations in device sizes, and these fluctuations can lead to large fluctuations in device threshold voltages and current leakage.

Not only do these fluctuations affect the yield of the circuits, but also the performance and reliability of the circuits are adversely affected. Therefore, on one hand, it is desirable to detect and diagnose various adverse effects of devices to improve the level of technology, and reduce the impact of process fluctuations; on the other hand, these effects and variability data are used for statistical modeling, to provide IC designers the mode, therefore, in the early stages of design process, the designers will be able to forecast the process fluctuation and the mismatch behavior of IC performance precisely. Transistor is one of the most widely used semiconductor devices in integrated circuit, in the process of fabricating integrated circuit, it is very important for improving integrated circuit technology and the yield of product to test the key parameters of transistors accurately.

SUMMARY

An addressable test circuit and test method for key parameters of transistor are disclosed herein.

An addressable test circuit configured to test parameters of a plurality of transistors (the "transistor" is labeled as "DUT" in the figures, where "DUT" refers to "device under test") includes: a combination logic circuit including a plurality of gate circuits and configured to select a transistor (DUT) and control the switches' state, a plurality of PADs, a plurality of address buses and data buses. In some embodiments, six of the data buses are test signal lines; in some embodiments, seven of the data buses are test signal lines. A plurality of inputs of the combination logic circuit are configured to connect with the plurality of address PADs through address buses, a plurality of outputs of the combination logic circuit are configured to connect with DUTs, and the DUTs are connected to the plurality of signal/test PADs through data buses.

The above-mentioned combination logic circuit includes an addressing circuit and a switching circuit, wherein the addressing circuit includes a row addressing circuit configured to select a row of transistors, and a column addressing circuit configured to select a column of transistors, so as to, only one DUT can be selected to test; the switching circuit includes a plurality of switching control circuits and a plurality of switches, wherein control signals can be generated by the switching control circuits to control the states of switches. A plurality of inputs of the addressing circuit are configured to address PADs, a plurality of outputs of the addressing circuit are coupled to switching control circuits, the output of switching control circuits are coupled to switches which connected to DUTs, and all DUTs are configured to test PADs through test signal lines (six or seven of data buses).

The addressable test circuit is applied to a plurality of transistors. Each transistor has Source (S) end, Drain (D) end, Gate (G) end and Substrate (B end). In some embodiments, the S end of each transistor is connected a first test signal line, and to a second test signal line through a first switch; the D end of each transistor is connected to a third test signal line through a second switch and to a fourth test signal line through a third switch; the G end of each transistor is connected to a fifth test signal line through a fourth switch; the B end of each transistor is connected a sixth test signal line. The S end and D end can be interchanged.

The S end of each transistor is connected to the first test signal line SF, and via the first switch $S_{SS}$ connected to the second test signal line SS; the D end of each transistor is connected to the third and fourth test signal lines DF, DL through the second switch $S_{DF}$ and a third switch $S_{DL}$, respectively; the G end of each transistor is connected to the fifth test signal lines GF through the fourth switch $S_{GF}$; the B end of each transistor is connected to the sixth test signal line BF.

In some embodiments, the S end of each transistor can be connected to the first test signal line SF through switch $S_{SF}$.

In some embodiments, the switches in the addressable test circuit are transmission gates or transistors.

In some embodiments, the switch $S_{DL}$ is NMOS. Thick-oxide device is commonly used as switch, such as PMOS, even if there is no voltage drop between S end and D end, the voltage drop still exist between S/D end and substrate. NMOS has obvious advantage, the voltage of substrate always is GND, therefore, we can control the voltage of S end and D end is GND to avoid voltage drop, therefore, NMOS is less likely to arise leakage phenomenon than PMOS.

The combination logic circuit includes addressing circuit (decoders), switching control circuits and a plurality of switches. The addressing circuit is used to select a DUT for testing, the common structure is shown in FIG. 1, addressing circuit includes X-pre-Decoder and Y-pre-Decoder, and the two decoders are comprised of a plurality of gate circuits (INV, NAND, NOR, NOT, etc), the number of gate circuits in X-pre-Decoder and Y-pre-Decoder is determined by the number of DUTs, the more DUTs, and the more gate circuits needed in decoder. A common sense in the field of digital circuits is: for one combination logic circuits, the truth table is only one, but for one truth table, it maybe corresponding to different combination logic circuits (for example, the logic circuit compose of an NAND and an INV has the same function with a basic gate circuit—AND), therefore, different circuits maybe realize the same selecting function. The switching control circuits are used to control the switches in on-state or off-state, similar to addressing circuit, the switching control circuits also composed of some gate circuits, the difference between addressing circuit and switching control circuits is the function of them.

In some embodiments, the addressable test circuit is configured to allow measurements of subthreshold leakage current $I_{off}$ and saturation current $I_{dsat}$, for example using current measurement equipment well known in the art. In some embodiments, $I_{dsat}$ and $I_{off}$ are measured in DF and DL signal lines of the addressable test circuit, respectively to ensure the accurate measurement of the two parameters in one circuit.

Moreover, a test method using the above address test circuit for testing parameters of a plurality of transistors is disclosed.

In some embodiments, using the above addressable test circuit, a transistor is selected to be test by addressing circuit, all the switches in circuit are controlled by switching control circuits: closing switch $S_{DF}$, $S_{DL}$, $S_{SS}$, $S_{GF}$, which connect to the selected device under test (SDUT), in the same time, unclosing other switches, the saturation current $I_{dsat}$ is measured in DF end. Under this situation, the DL signal line is used to sense voltage. there are force and sense voltage connections between the DF and DL signal lines of D end, the SF and SS signal lines of S end, forcing a voltage to D/S end through DF and SF, the voltage of D/S can be detected through the induced voltage end DL and SS to judge whether it meets measurement conditions, if not, adjusting the applied voltage.

In some embodiments, using the above addressable test circuit, a transistor is selected to be tested by the addressing circuit, all the switches in circuit are controlled by switching control circuits: closing switch $S_{DL}$, $S_{GF}$, which connect to SDUT and switch $S_{DF}$, $S_{SS}$ which connect to the non-selected device under test (NDUT), in the same time, unclosing other switches, the applied voltage between DF and DL end is equal, the subthreshold leakage current is measured in DL end. In the circumstances, the DL signal line is not used to sense the voltage of DF end, but force voltage to DL end, the voltage forced to DL end is equal to the voltage of DF end to avoid the test accuracy of $I_{off}$ due to voltage drop.

In some embodiments, using the addressable test circuit to measure the key parameters of transistor, the G ends of each transistor, can also be connected to a seventh signal line via a switch, respectively. The influence of G end in the measurement of saturation current and sub-threshold leakage current is very small, but when measuring other parameters of G end (such as leakage current of G end), the G end also needs to plus a signal line for sensing the voltage of GF signal line or applying corresponding equilibrium voltage. Under the circumstances, the switch in the seventh signal line, which connected to the SDUT need to be unclosed, and the switch in the seventh signal line, which connected to the NDUT need to be closed.

The functions of test signal line DF, DL, SF, SS, GF, GL are described below.

DF: the test signal line to measure $I_{dsat}$, to measure $I_{dsat}$, forcing a corresponding voltage to D end of the selected transistor, and testing the end's current; to measure $I_{off}$, forcing a corresponding voltage to D end of the unselected transistors.

DL: the test signal line to measure $I_{off}$, to measure $I_{off}$, forcing a corresponding voltage to D end of the selected transistor, and testing the end's current; to measure $I_{dsat}$, sensing actual voltage of the selected transistor's D end.

SF: the S end of each DUT connects to the test signal line, it can be used to force corresponding voltage to S end.

SS: the signal line can be used to sense actual voltage of the selected transistor's S end.

GF: the G end of each DUT is connected to GF signal line, it can be used to force corresponding voltage to G end.

GL: sensing actual voltage of the selected transistor's G end.

The test circuit according to some embodiments disclosed herein has a high area utilization rate, therefore, it has the capacity to put a lot of transistors within one little wafer area, besides, each transistor's $I_{dsat}$, $I_{off}$ can be measured accurately in one circuit.

Other embodiments and implementations may become apparent in view of the following drawings and the detailed description.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent in view of these drawings.

DETAILED DESCRIPTION

For a transistor, some parameters need to be detected may include the saturation current $I_{dsat}$, the threshold voltage $V_t$, the subthreshold leakage current $I_{off}$ etc. In a conventional short-range test chip, each port of the being-tested transistor individually connects to the probe pin (PAD). PADs occupy large areas in wafers, therefore, the number of PAD is limited, resulting in the number of transistors that can be measured is limited, and low rate area utilization of the test chip. As such, test chips designed by this method are unable to meet the needs of transistor statistical modeling.

An addressable circuit can be used to test numerous devices because of the advantage of sharing PADs in testing, engineers integrated it into test chip design to test more devices. Ordinary addressable test chip includes a plurality of PADs, a combinational logic circuit and test units, wherein, the combinational logic circuit including a row addressing circuit (row decoder), a column addressing circuit (column decoder) and a switching circuit. The row addressing circuit selecting a needed row of test units, column addressing circuit selecting a needed column of test units simultaneously, it means that a certain test unit is selected by addressing circuit. The switching control circuits are used to control the switches in on-state or off-state.

When a certain test unit is selected, the switches connected to the test unit are on, therefore, the test unit can be tested. The combination logic circuit is comprised of several logic gate circuits, the connection among these logic gates is design by a certain logic function, according to the logic function, the output signals of combination logic circuit are decided by different input signals, and the output signals can be used to select test unit and control the state of switches in test chip. Moreover, A common sense in the field of digital circuits is: one combination logic circuits, corresponding to only one truth table; for one truth table, it maybe corresponds to different combination logic circuits.

Figure 1A:
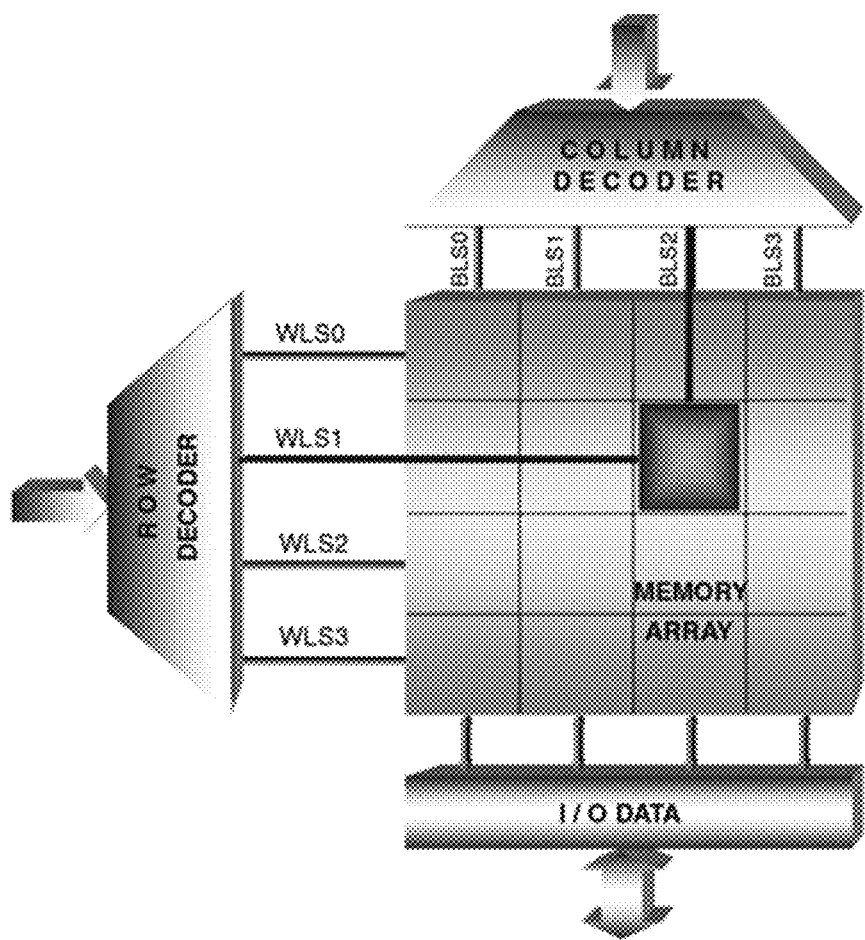
FIG. 1A is a diagram of an SRAM address decoder.

As shown in FIG. 1A, in a SRAM addressable circuit (SRAM address decoder), the combination logic circuit is decoder in this circuit, the SRAM addressable circuit can select a memory to test through column decoder (equal to "column address circuit") and row decoder (equal to "row address circuit").

Figure 1B:
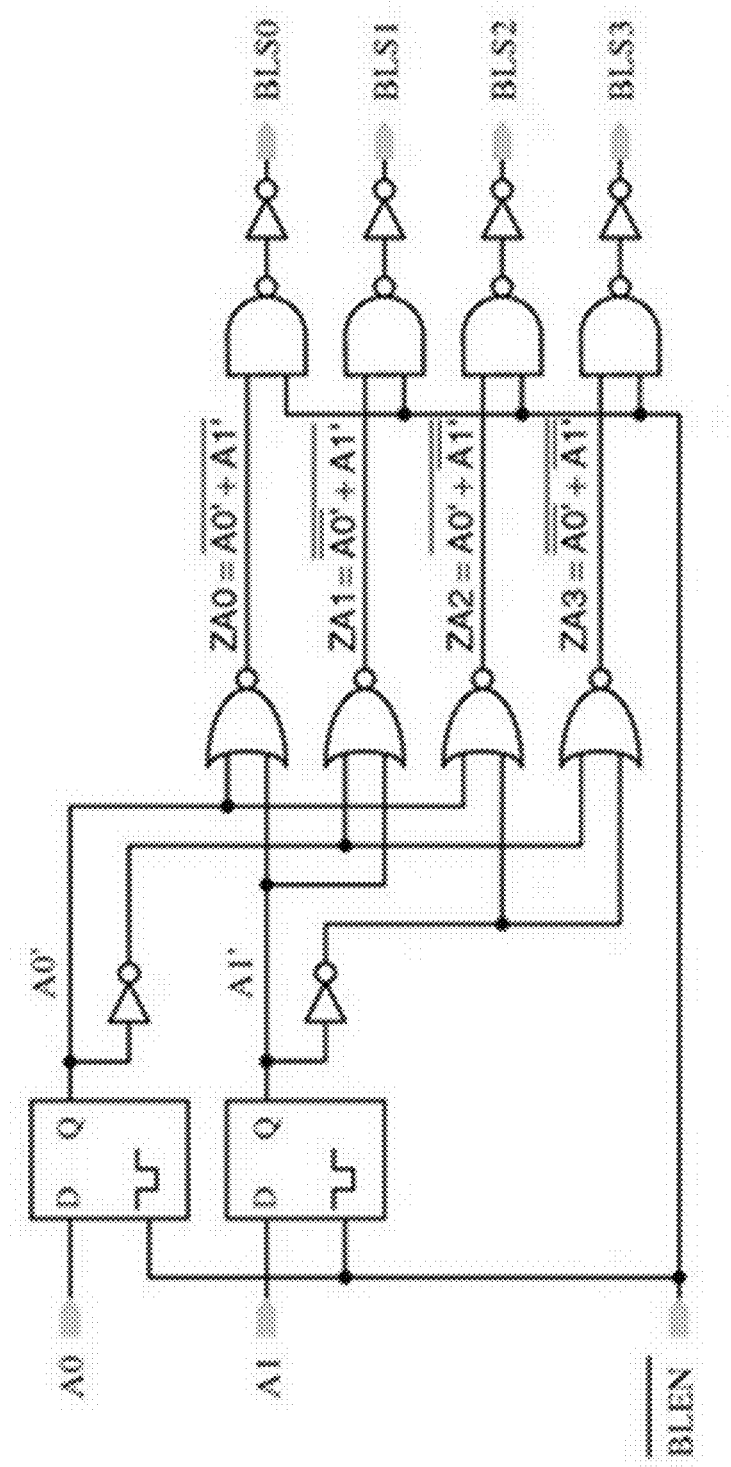
FIG. 1B is a diagram of a 2-4 NOR-based address Y-pre-decoder of the SRAM address decoder in FIG. 1A.

FIG. 1B illustrates a 2-4 NOR-based address Y-pre-decoder, which can be suitable for the SRAM addressable circuit as the column decoder. Moreover, decoder is a kind of combination logic circuit comprised with logic gate circuits. Similarly, the 2-4 NOR-based address Y-pre-decoder is not the only decoder as the column decoder, different decoders with the same truth table can be used as the column decoder to replace it.

Figure 2:
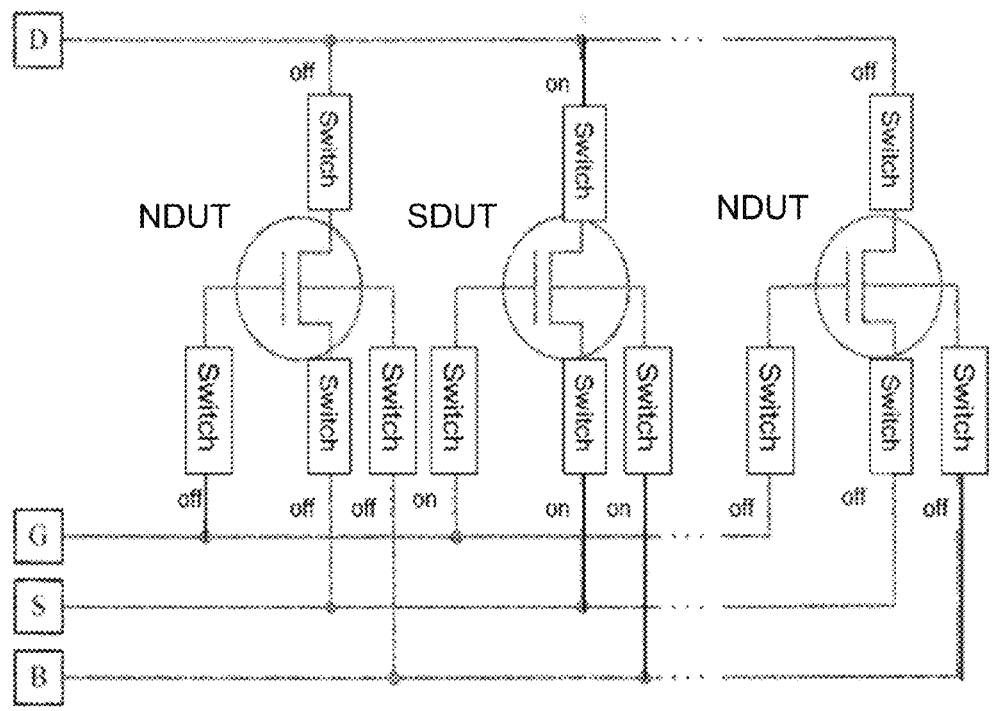
FIG. 2 illustrates a conventional test circuit structure.

Therefore, an addressable circuit also can be used to test a plurality of transistors. The switching circuit is designed between PADs and each port of transistors, and includes switching control circuits and a plurality of switches, and the switches are controlled by switching control circuits of the combination logic circuit. As shown in FIG. 2, for a conventional addressable test chip of transistor, when a transistor is selected, all switches connected to the transistor is in on-state, all witches connected to the other transistors are in off-state. Since all transistors shared a group of PADs through addressable circuits and switch circuits, the problem of measuring large number of transistors in a limited area on wafer is solved, and the test method greatly improves the test chip area utilization, therefore the test chip design approach in advance process node applications is very broad.

Figure 3:
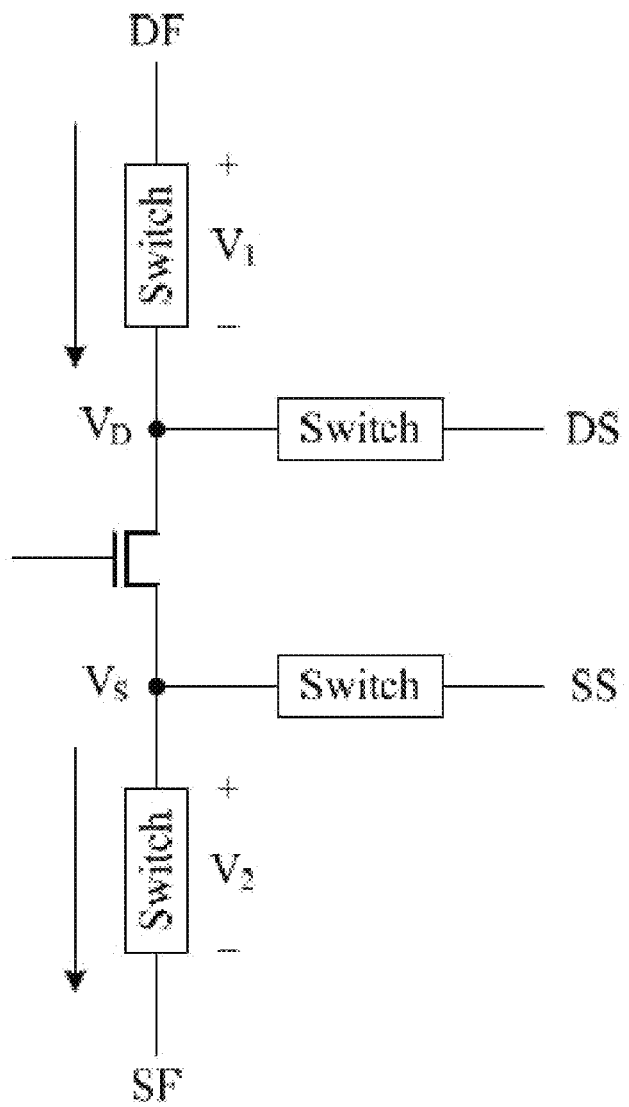
FIG. 3 illustrates a four-terminal test structure for transistors.

Because the switches in switching circuit are not the ideal switches, when a switch in on-state, the conduction resistance (Ron) is existed. Therefore, in addressable test chip, the test signal line end is applied a specific voltage, the voltage in the port of selected transistor is different with the applied voltage. This difference is particularly evident in measuring Last, the lead resistance and the conduction resistance of switch circuit produce significant voltage drop due to the flow through $I_{dsat}$, the greater $I_{dsat}$, the greater voltage will be generated, the influence in measurement can't be ignored. In order to solve this problem, a common practice is four terminal measurement: two test signal lines are connected to D end and S end of transistor respectively, one line is applied to force voltage, another signal line is to sense voltage. Detecting the voltage of D end or S end by the sense end, if the voltage does not meet the measurement conditions, adjusting the force voltage to eliminate the influence due to voltage drop on conduction resistance and lead resistance, as show in FIG. 3.

However, the greater $I_{dsat}$ of a DUT, the greater voltage drop arose from conduction resistance of switch circuit and lead resistance, so that the force end need to force greater voltage. When this voltage exceeds the bear range of switching circuit which was connected to force end directly, the switching circuit will breakdown, and the whole chip can't work properly. In view of this, within the voltage range of the switching circuit, to make the greater range of DUT's $I_{dsat}$ can be measured, the conduction resistance of switching circuit must be smaller.

Figure 4:
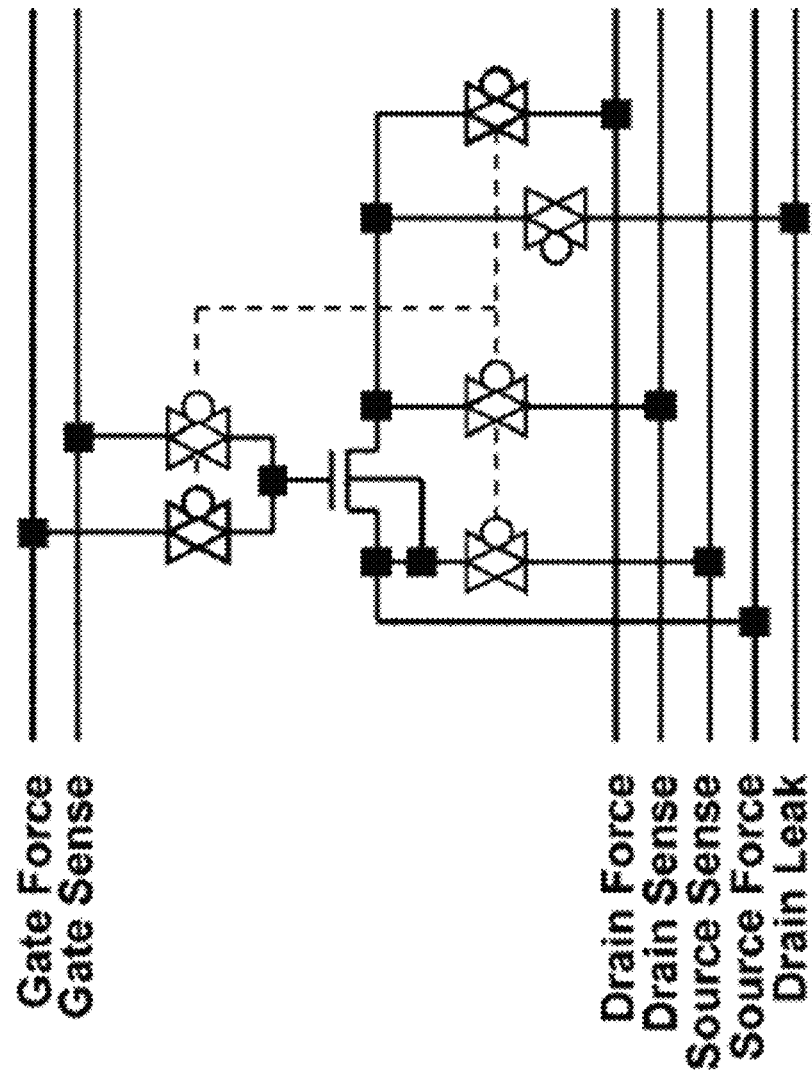
FIG. 4 illustrates a conventional transistor test circuit.

Brad Smith et al, "A Novel Technique for Addressable Parametric Arrays" IEE Transactions on Semiconductor Manufacturing, Vol. 22, No. 1, pp 134-145, February 2009. Based on the above four terminal measurement, a method of applying bias voltage on the D terminal of transistor is put forward. As shown in FIG. 4, when measuring the subthreshold leakage current, the D end of a selected DUT is connected to DF signal line, the drain (D) end of other unselected DUTs are connected to DL signal line, increasing the bias voltage between the source (S) end and the substrate of transmission gate SDF through applying voltage on DL, and increasing the threshold voltage to decrease leakage.

This method can have three disadvantages: (1) the bigger Background leakage current will be produced due to the introduced transmission gate SQL which connected to the signal line DL; (2) the saturation current and the threshold leakage current of transistor were tested on DF. The testable saturation current range of the circuit is associated with the current capacity of switching circuit can pass. Therefore, it requires switching circuit is very small, but the smaller resistance, the greater background leakage current will be introduced, the accuracy of sub-threshold leakage current will be influenced; (3) when measuring the sub-threshold leakage current, the compensation voltage of the DL end need to determine by the size of actual switching circuit and the actual process, it is not convenient to measure.

In the above two circuit structures, there is still a certain electric leakage when switch circuit is in off state. A plurality of transistors share a test signal line through switch circuits, the effect on measurement due to accumulated electric leakage of switch circuit can't be ignored, especially for $I_{off}$ and $G_{leak}$.

Takashi Sato et al, "A transistor-Array for Accurate Measurement of Subthreshold Leakage Variation" IEEE Proceeding of the 8th ISQED'07, the method in the paper to measure subthreshold leakage is that, inserting a selector between working voltage or ground voltage (VDD/GND) of transistor and the drain end of DUT, and the said selector is comprised of PMOS.

Figure 5A:
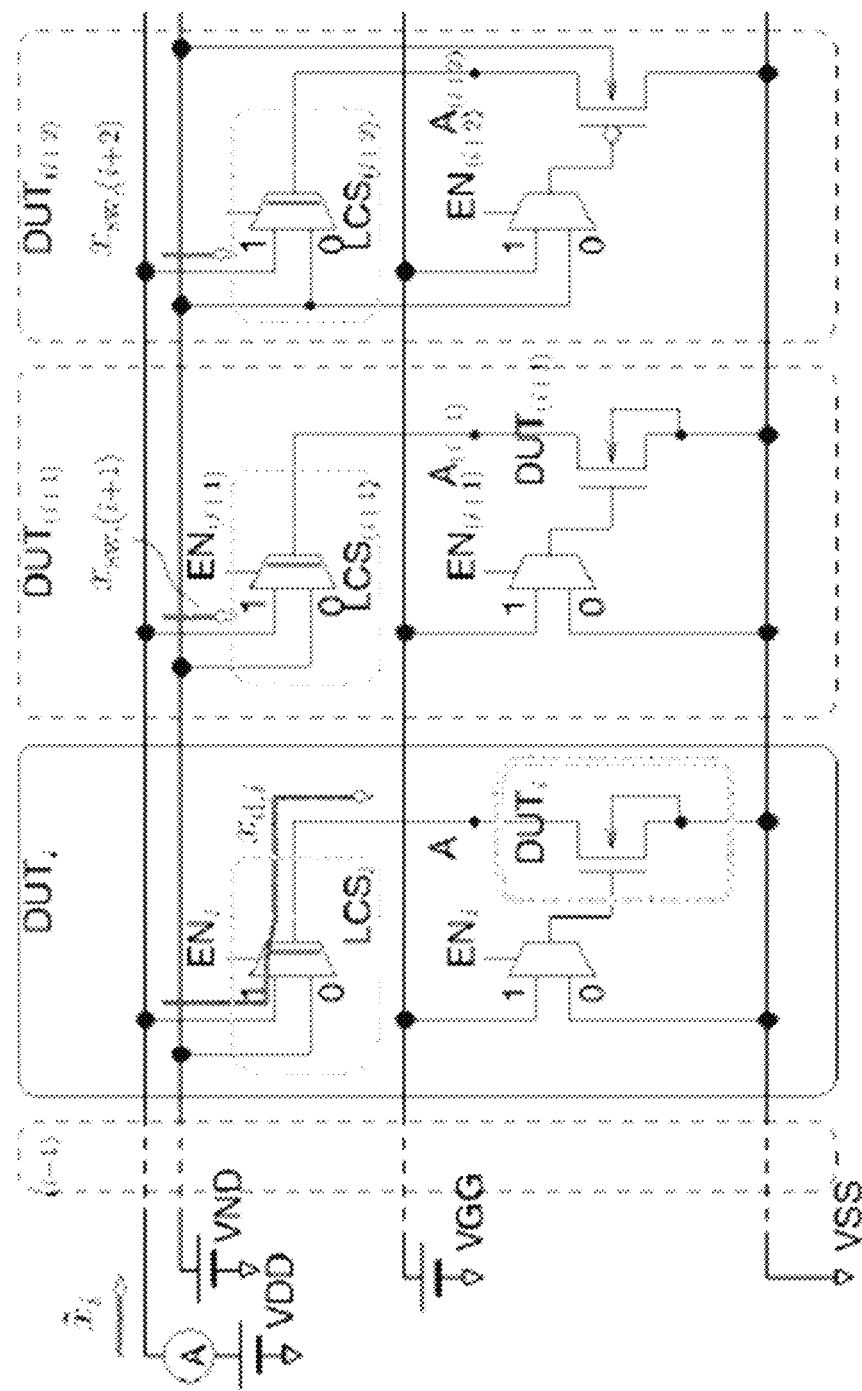
FIG. 5A illustrates another transistor test circuit.
Figure 5B:
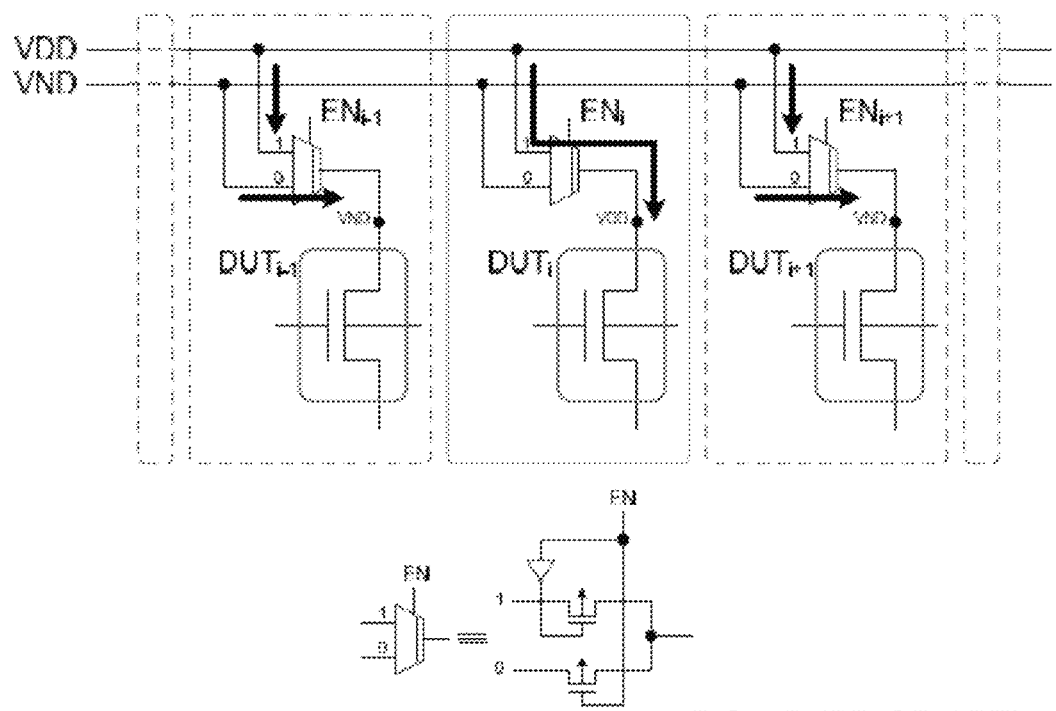
FIG. 5B illustrates yet another transistor test circuit.

As shown in FIG. 5A, these selectors select a DUT under the control of EN signal, the selected transistors connected with VDD signal line, the unselected transistors connected with GND signal line. The electric leakage of selected transistor is tested in VDD end, to reduce the effect on measurement which is arose from the electric leakage of unselected transistors. The supply voltage of GND is equal to VDD to make sure no voltage drop between unselected transistors and the source-drain end of PMOS which connect to VDD, and reduce the impact on measurement arose from electric leakage of PMOS switches. FIG. 5B is another example of a conventional test circuit for transistor parameters.

The shortcomings can include: (1) the PMOS is a thick-oxide device, the substrate voltage is larger than the force voltage VDD/GND when testing sub-threshold leakage current of DUT, so that, even if there is no electric leakage between source end and drain end, there still has voltage drop between source end and substrate, and a certain electric leakage; (2) using a PMOS as a switch of D end, so as to reduce the electric leakage current of switch, but the switch's conduction resistance will be very large, this will effects the measurement of $I_{dsat}$, therefore, in this paper, sato et al using another circuit to test $I_{dsat}$.

Thus, it can be seen that, there is many addressable test chips to test saturation current of transistor, but due to transistors share common test signal line through addressable circuits and switching circuit, the effect on measurement accuracy arose from accumulated background leakage current of switch circuit is very large, sub-threshold leakage current is rarely tested, and it is difficult to test sub-threshold leakage current accurately meanwhile to test saturation current accurately. Some embodiments of the present disclosure can solve the problem of accurately measuring the saturation current and the sub-threshold leakage current of the transistor in one circuit.

Various embodiments of the present disclosure will be further described in conjunction with the drawings and specific embodiments, but the scope of protection of the present invention is not limited thereto.

Example 1

Figure 6:
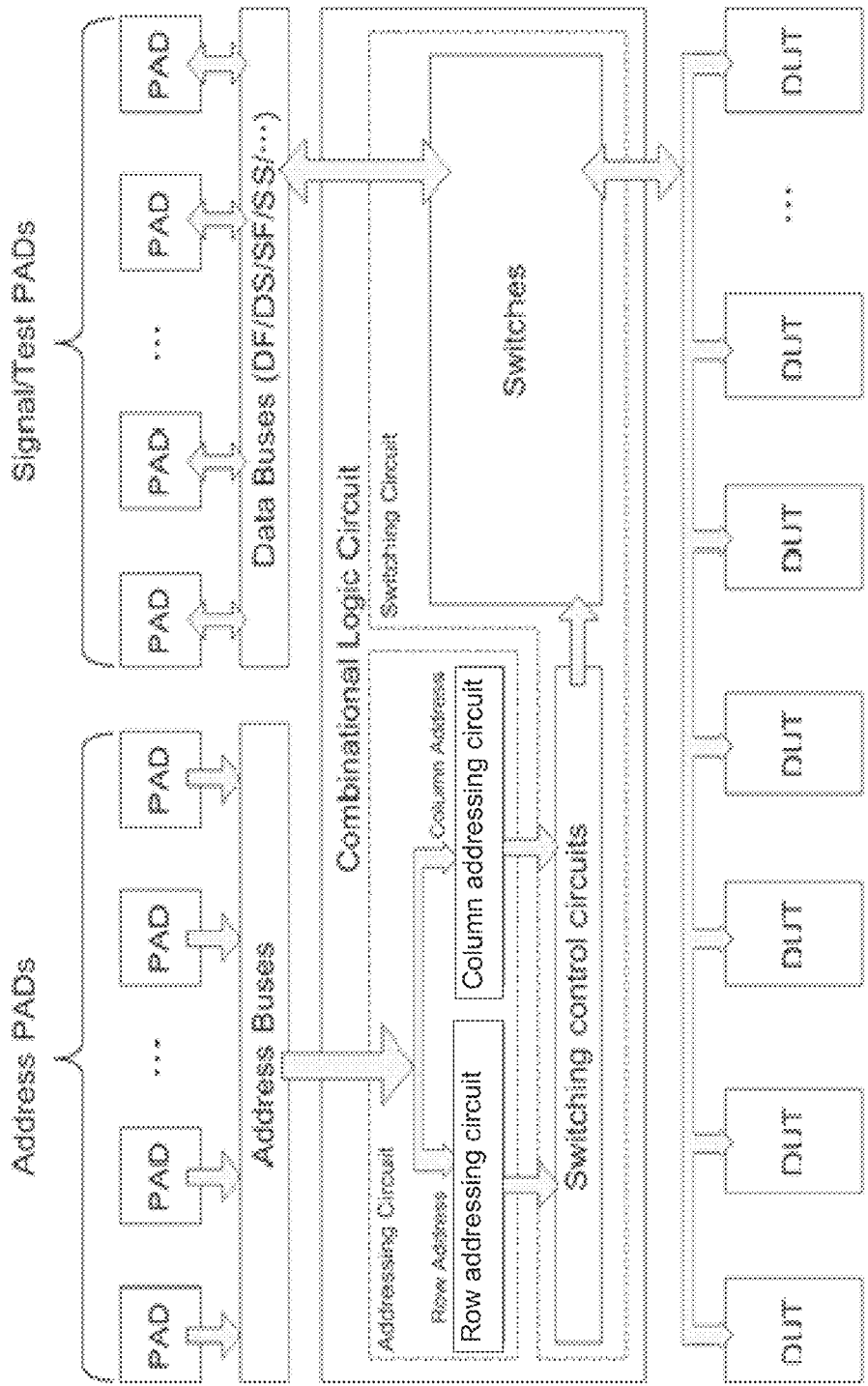
FIG. 6 is a diagram of an addressable test circuit according to some embodiments.

An addressable test circuit configured to test parameters of a plurality of transistors, as shown in FIG. 6, is configured to select a plurality of DUTs (transistors); the addressable test circuit includes: a combination logic circuit configured to select a device under test (DUT), and the combination logic circuit comprised of many of gate circuits; a plurality of address buses and data buses (connecting lines), and six of the data buses are test signal lines; a plurality of PADs. a plurality of inputs of combination logic circuit are coupled to the plurality of address PADs, a plurality of outputs of combination logic circuit are coupled to DUTs, The combination logic circuit includes an addressing circuit including a row addressing circuit and a column addressing circuit, and a switching circuit, wherein the addressing circuit is used to select a DUT, and the switching circuit includes a plurality of switching control circuits and a plurality of switches, and the switching control circuits are used to control the switches' states.

Figure 7:
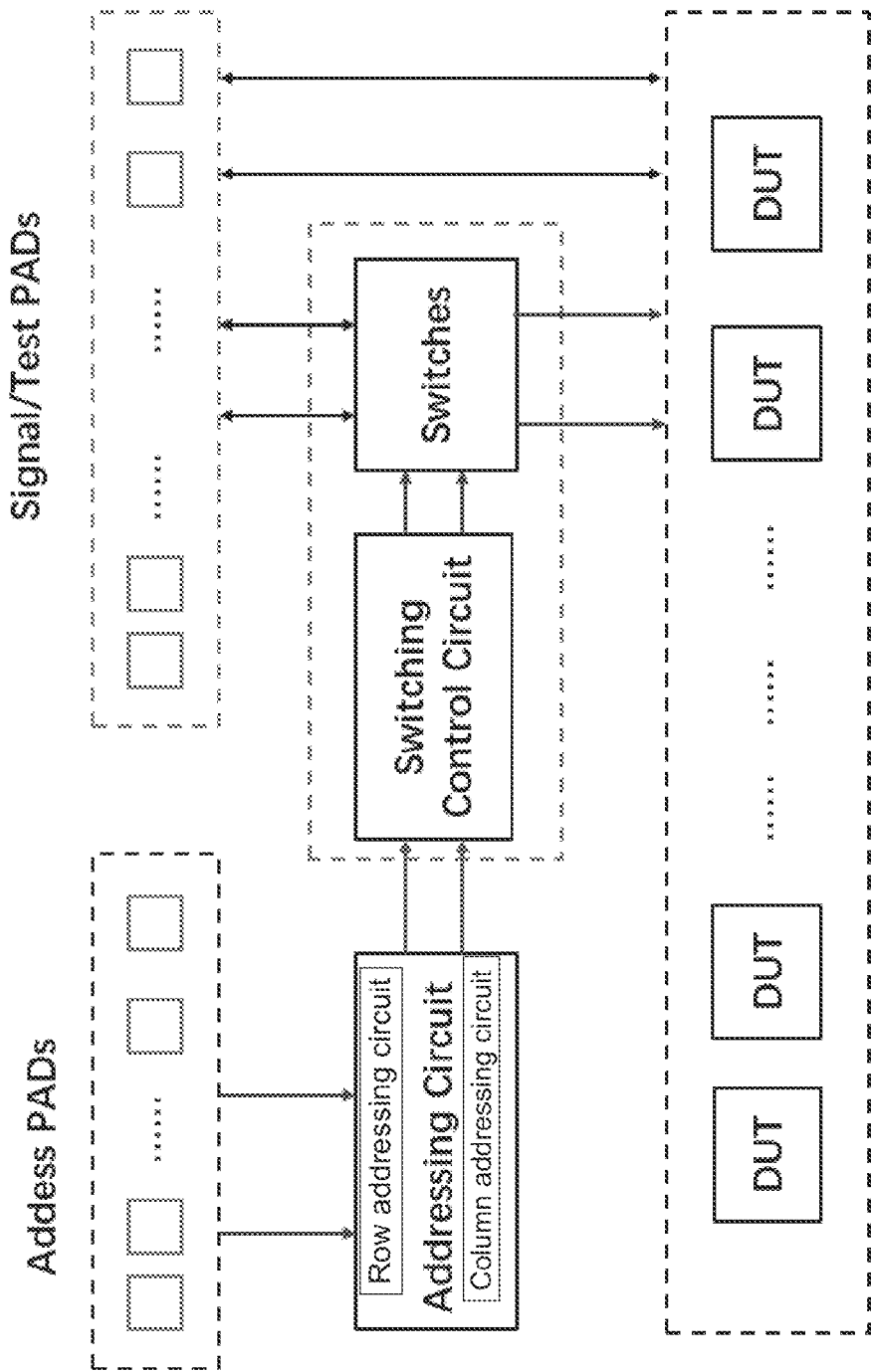
FIG. 7 is another diagram of an addressable test circuit diagram according to some embodiments.

As shown in FIG. 7, a plurality of inputs of the addressing circuit including the row addressing circuit and the column addressing circuit are coupled to the plurality of address PADs, and a plurality of outputs of the addressing circuit including the row addressing circuit and the column addressing circuit are coupled to the switching control circuits through address buses, wherein the switching control circuits are coupled to the switches that connect the DUTs, and the DUTs are connected to signal/test PADs through six test signal lines (data buses).

Each transistor has Source (S) end, Drain (D) end, Gate (G) end and Substrate (B end), all transistors shared a set of signal lines through the addressing circuit. The shared signal lines of the D, S, B end of each transistor connect to different PADs one by one. When the source voltage is applied through PADs, the addressing circuit of combinational logic circuit selects only one DUT as the test object, the switching control circuits of switching circuit control the switches' state which connected to DUTs, to measure different electrical parameters.

Figure 8:
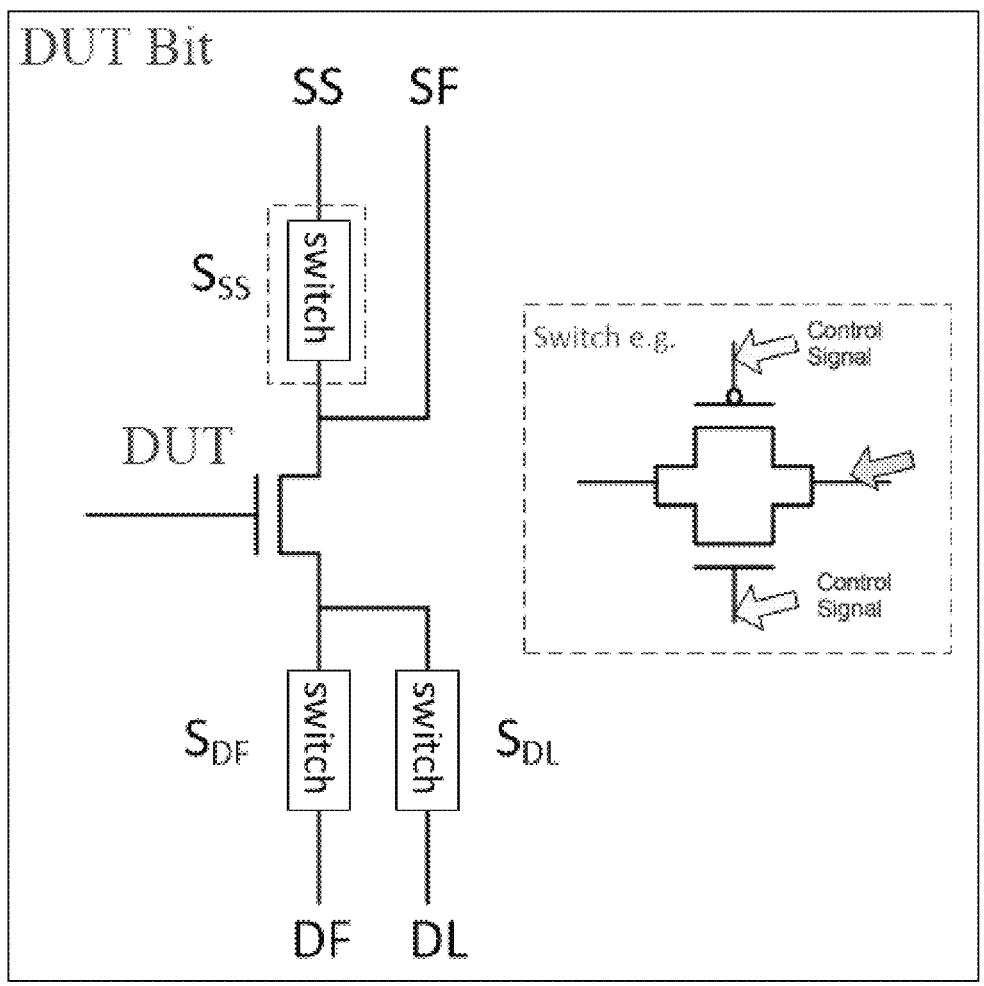
FIG. 8 is a diagram of a DUT Bit according to some embodiments.

A circuit structure of a DUT and the switches connected to the DUT can be referred to as a DUT Bit. An example DUT Bit is illustrated FIG. 8, and the working principle of the switching control circuits also be shown in FIG. 8. Each switch can be a transmission gate or a single transistor. The control signal generated by the switching control circuits which are connected to the G end of the transistor to control the switch in on-state or off-state. For NMOS, the voltage of control signal is high, the G end voltage is high, NMOS will be turned on; conversely, the voltage of control signal is low, NMOS will be turned off. PMOS is just contrary to the NMOS. The voltage of the G end of NMOS and PMOS in transmission gate is inverted, so that the NMOS and PMOS of the transmission gate can be simultaneously switched on or off.

Figure 9A:
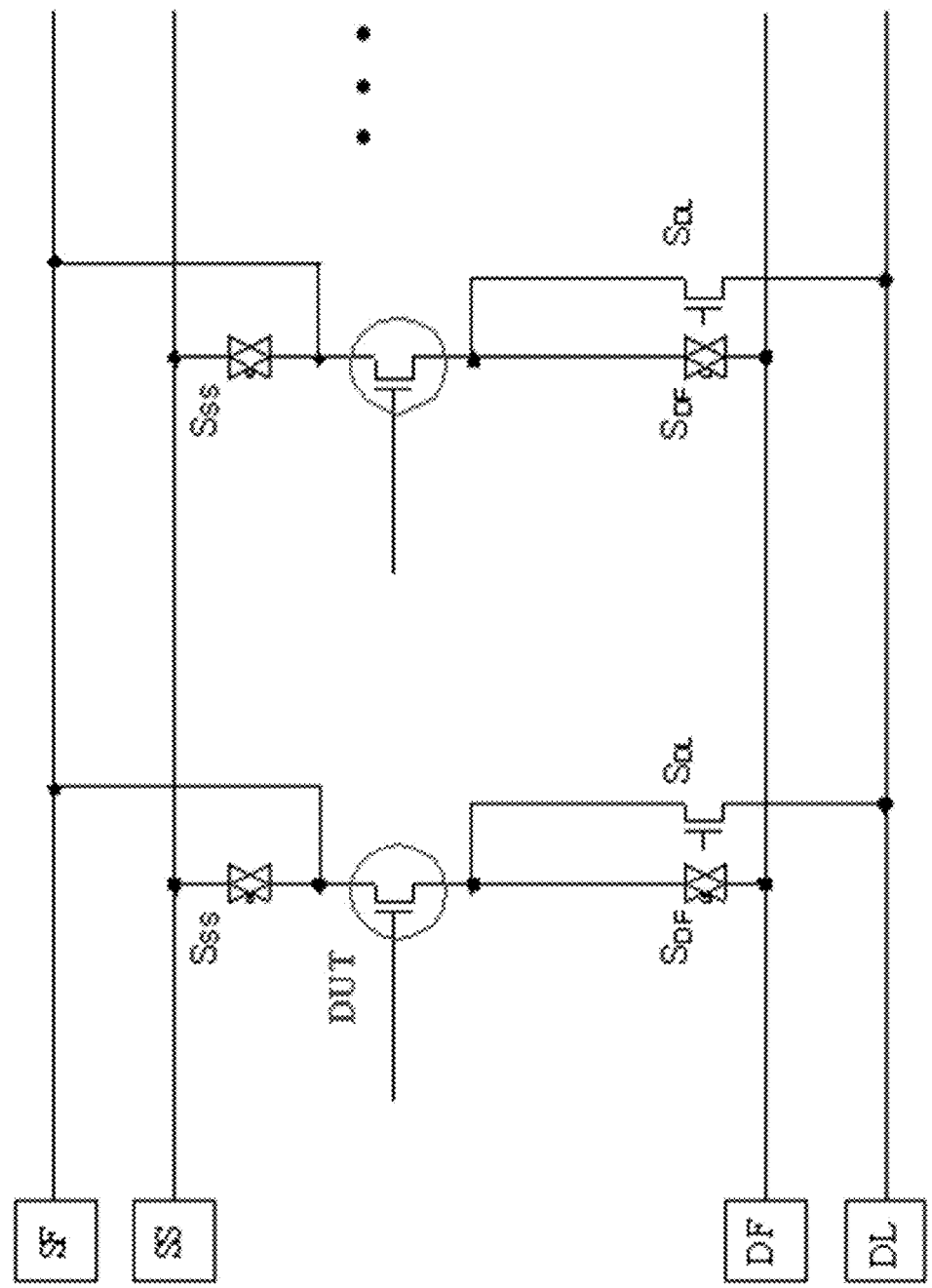
FIG. 9A illustrates a test circuit including four test signal lines according to some embodiments.

Referring to FIG. 9A, an addressable test circuit used to measure key parameters of transistor is illustrated as having four test signal lines. Wherein the said addressable test circuit is applied to a plurality of MOS transistors, each MOS transistor has a gate end a drain end D, a source end S, and a substrate B, wherein, the S end of each MOS transistor connects to test signal line SF directly, at the same time, the S end of each MOS transistor connects to test signal line SS though switch $S_{SS}$, the D end of each MOS transistor connects to test signal line DF and DL through switch $S_{DF}$ and $S_{DL}$, wherein, switch $S_{DL}$ is NMOS, and other switches are transmission gates, the state of all switch circuits are controlled through the selection signals which are generated by addressable circuit, and the addressable circuit is composed of combinational logic circuits.

A test method of an addressable test circuit to measure the key parameters of MOS transistor, characterized in that, selecting one of the MOS transistors as the DUT through addressable circuit, and measuring its $I_{dsat}$ and $I_{off}$ respectively. In the drawings, the selected DUT by addressable circuit is abbreviated as SDUT, the unselected DUT is abbreviated as NDUT)

To measure saturation current $I_{dsat}$, closing switch $S_{DF}$, $S_{DL}$, $S_{SS}$ which connect to SDUT, in the same time, unclosing all switches which are connect to NDUT, the D end of the selected MOS transistor is applied voltage connection, and the S end is induced voltage connection, and DF, SF belong to force end, FL, SS belong to sense end, giving a voltage to force end, at the same time, the voltage of D/S end can be detected through the sense end to judge whether it meets the measurement conditions, if not, adjusting the applied voltage, measuring the saturation current $I_{dsat}$ in DF end. Within the voltage range which the switch circuit can withstand, to make the greater range of DUT's $I_{dsat}$ can be measured, the conduction resistance of switch circuits must be smaller. All DUT's S ends are connected to the signal line SF directly without switches' conduction resistance, and the connection resistance is very small, the switch in DF end is transmission gate, its conduction resistance is very small too, and the conduction resistance can be smaller through adjusting the size of transmission gate. So that, the range of DUT's $I_{dsat}$ is very large, in addition, the transmission gate's resistance is a constant when the transmission gate accord with a certain size ratio, this character is very useful in measurement, the compensating voltage can be obtained through calculating, therefore, the testing speed will be accelerated.

To measure subthreshold leakage current $I_{off}$, closing switch $S_{DL}$ which connect to the selected MOS transistor and switch $S_{DF}$, $S_{SS}$ which are connected to unselected MOS transistors, in the same time, unclosing all other switches, connecting the selected MOS transistor's D end to signal line DL, and the unselected MOS transistors' D end to signal line DF, this will reduce the effect on measurement caused by unselected MOS transistors' current leakage; at the same time, the supply voltage of DF end is equal to DL end's supply voltage, to make sure the both sides of switch $S_{DL}$ which connect to signal line DL of unselected MOS transistors have no voltage drop, and reduce the effect on measurement caused by switch current leakage, the subthreshold leakage current $I_{off}$ is measured in DL end. $I_{off}$ and $I_{dsat}$ are measured in different signal lines, switch $S_{DL}$ can reduce electric leakage caused by itself through adjusting its own size, so that, the increase of conduction resistance has no effect on measuring $I_{dsat}$. wherein, switch $S_{DL}$ is NMOS. The thick-oxide device is selected generally as switch circuit, but the substrate voltage is larger than general core device, even if there is no voltage drop between source end and drain end, there still has voltage drop between source end and substrate. The substrate's voltage of NMOS is GND, the voltage through the source end and drain end of NMOS also is GND, therefore, NMOS has less current leakage than PMOS.

Saturation current $I_{dsat}$ and subthreshold leakage current $I_{off}$ are two important parameters to judge MOS transistors' characters in nanometer process.

Figure 9B:
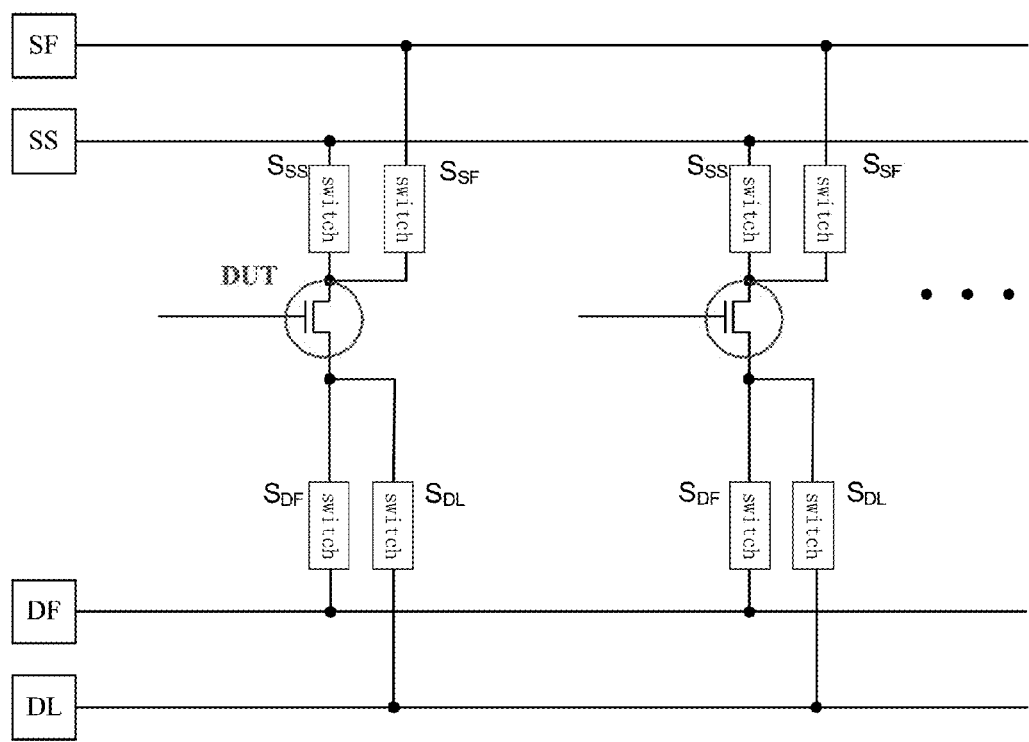
FIG. 9B illustrates a test circuit including four test signal lines according to some other embodiments.

Referring to FIG. 9B, the S end of each MOS transistor connects to test signal line SF through switch $S_{SF}$, by contrast, the S end of each MOS transistor connect to test signal line SF directly.

The working principle of present embodiment can include: selecting one of the MOS transistors as the DUT through addressable circuit, and measuring its $I_{dsat}$ and $I_{off}$ respectively.

To measure saturation current $I_{dsat}$, closing switch $S_{DF}$, $S_{DL}$, $S_{SS}$, $S_{SF}$ which connect to SDUT, at the same time, unclosing $S_{DF}$, $S_{DL}$, $S_{SS}$, $S_{SF}$ which connect to NDUT, the D end of the selected MOS transistor is applied voltage connection, the S end is induced voltage connection, and DF, SF belong to force end, DL, SS belong to sense end, giving a voltage to force end, at the same time, the voltage of D/S end can be detected through the sense end to judge whether it meets the measurement conditions, if not, adjusting the applied voltage to eliminate bad effects on the measurement, the effects are arose from the drop voltage of conduction resistance and line resistance, the saturation current $I_{dsat}$ is measured in DF end.

To measure subthreshold leakage current $I_{off}$, closing switch $S_{DL}$, $S_{SF}$ which connect to the selected MOS transistor and switch $S_{DF}$, $S_{SS}$ which are connected to unselected MOS transistors, in the same time, unclosing $S_{DF}$, $S_{SS}$ which connect to the selected MOS transistor and switch $S_{DL}$, $S_{SF}$ which are connected to unselected MOS transistors, connecting the selected MOS transistor's D end to signal line DL, and the unselected MOS transistors' D end to signal line DF, this will reduce the effect on measurement caused by unselected MOS transistors' electric leakage; at the same time, the supply voltage of DF end is equal to DL end's supply voltage, to make sure the both sides of switch $S_{DL}$ which connect to signal line DL of unselected MOS transistor have no voltage drop, and reduce the effect caused by switch electric leakage on measurement, the subthreshold leakage current $I_{off}$ is measured in DL end.

Switch $S_{SF}$, like other switches, can use a transmission gate or a single MOS transistor.

Figure 9C:
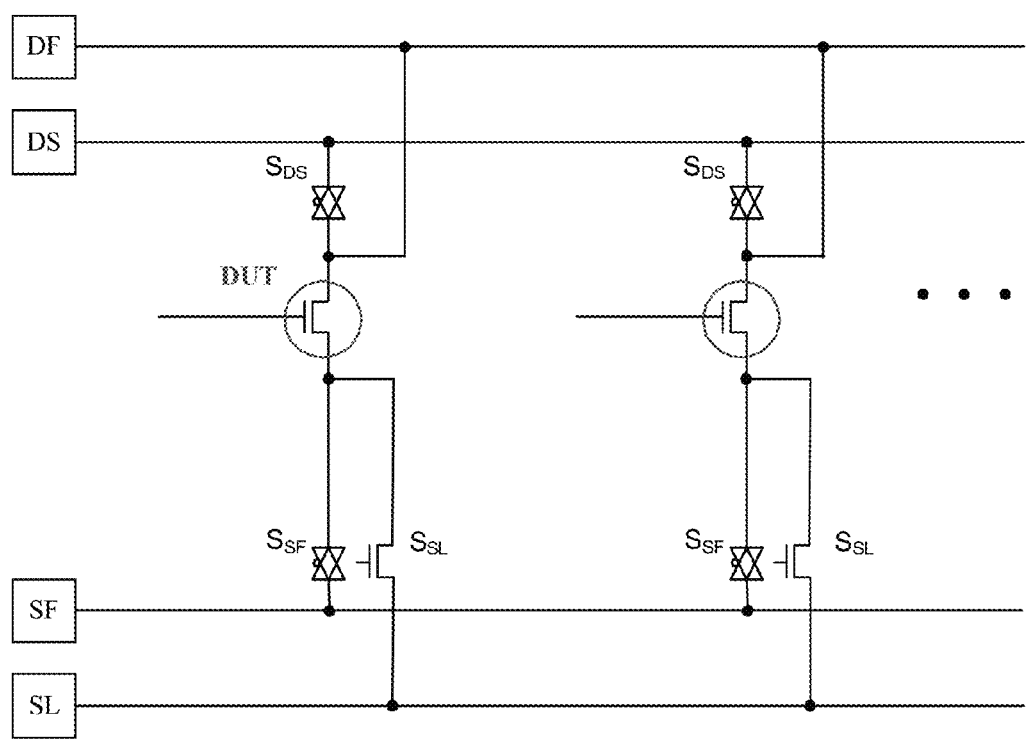
FIG. 9C illustrates a test circuit including four test signal lines according to some other embodiments.

Referring to FIG. 9C, the D end of each MOS transistor connects to test signal line DF directly, at the same time, the D end of each MOS transistor connects to test signal line DS though switch $S_{DS}$; the S end of each MOS transistor connects to test signal line SF and SL through switch $S_{SF}$ and $S_{SL}$ respectively.

The working principle of present example as following: selecting one of the MOS transistors as the DUT through addressable circuit, and measure its $I_{dsat}$ and $I_{off}$ respectively.

To measure saturation current $I_{dsat}$, closing switches $S_{SF}$, $S_{SL}$, $S_{DS}$ which connect to SDUT, at the same time, unclosing $S_{SF}$, $S_{SL}$, $S_{DS}$ which connect to NDUT, the D end of the selected MOS transistor is applied voltage connection, the S end is induced voltage connection, and DF, SF belong to force end, SL, DS belong to sense end, giving a voltage to force end, at the same time, the voltage of D/S end can be detected through the sense end to judge whether it meets the measurement conditions, if not, adjusting the applied voltage to eliminate bad effects on the measurement, the said effects are arose from the drop voltage of conduction resistance and line resistance. The saturation current $I_{dsat}$ is measured in SF end.

To measure subthreshold leakage current $I_{off}$, closing switch $S_{SL}$ which connects to the selected MOS transistor and switch $S_{SF}$, $S_{DS}$ which are connected to unselected MOS transistors, in the same time, unclosing $S_{SF}$, $S_{DS}$ which connect to the selected MOS transistor and switch $S_{SL}$ which connects to unselected MOS transistor, connecting the selected MOS transistor's S end to signal line SL, and the unselected MOS transistors'S end to signal line SF, this will reduce the effect on measurement caused by unselected MOS transistors' electric leakage; at the same time, the supply voltage of SF end is equal to SL end's supply voltage, to make sure the both sides of switch $S_{SL}$ of unselected MOS transistor which connect to signal line SL have no voltage drop, and reduce the effect on measurement caused by switch electric leakage. The subthreshold leakage current $I_{off}$ is measured in the SL end.

Figure 9D:
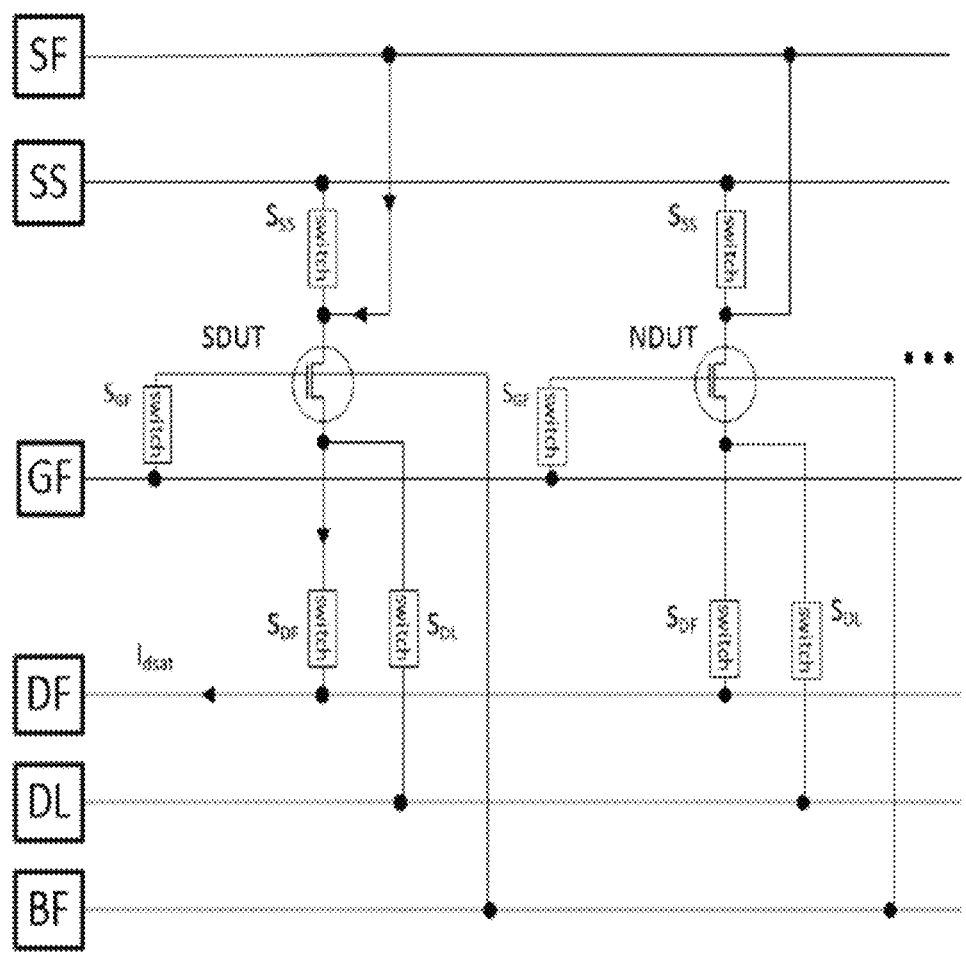
FIG. 9D is a circuit structure configuration diagram of when measuring $I_{dsat}$ according to some embodiments, which includes six test signal lines, and the saturation current $I_{dsat}$ is measured at the DF end.

The circuit structure of a plurality of DUT Bits is shown in FIG. 9D: the S end of each transistor connects to test signal line SF directly, at the same time, the S end of each transistor connects to test signal line SS though switch $S_{SS}$, the D end of each transistor connects to test signal line DF and DL through switch $S_{DF}$ and $S_{DL}$, the G end of each transistor connects to test signal line GF though switch $S_{GF}$, the B end of each transistor connects to test signal line BF directly. Wherein, switch $S_{DL}$ is NMOS, and other switches are transmission gates or single MOS transistors; the state of all switches are controlled through switching control circuits which are decided by the selection signals, the selection signals are generated by addressable circuit, the addressable circuit and the switching circuit belong to the combinational logic circuit.

In the above addressable circuit, the addressable circuit selecting one of the transistors as the DUT, and measuring $I_{dsat}$ and $I_{off}$ in the DF end and DL end respectively. (In some embodiments, the selected DUT by addressable circuit is abbreviated as SDUT, the unselected DUT is abbreviated as NDUT)

To measure saturation current $I_{dsat}$, as shown in FIG. 9D, closing switch $S_{DF}$, $S_{DL}$, $S_{SS}$, $S_{GF}$ which connected to SDUT, in the same time, unclosing all switches which are connect to NDUT, the D end of the selected transistor is applied a voltage connection, and the S end is induced a voltage connection, and DF, SF are force ends, DL, SS are sense ends, giving a voltage to force ends, at the same time, the voltage of D/S end can be detected through the sense end to judge whether it meets the measurement conditions, if not, adjusting the applied voltage, measuring the saturation current $I_{dsat}$ in DF end. Within the voltage range which the switching circuit can withstand, in order to make the greater range of DUT's $I_{dsat}$ can be measured, the conduction resistance of switching circuit must be smaller. All DUT's S ends are connected to the signal line SF directly without switches' conduction resistance, and the connection resistance is very small, the switch in DF end is transmission gate, its conduction resistance is very small too, and the conduction resistance can be smaller through adjusting the size of transmission gate. So as to, the range of DUT's $I_{dsat}$ is very large, in addition, the transmission gate's resistance is a constant when the transmission gate accord with a certain size ratio, this character is very useful in measurement, the compensating voltage can be obtained through calculating, therefore, the testing speed will be accelerated.

Figure 9E:
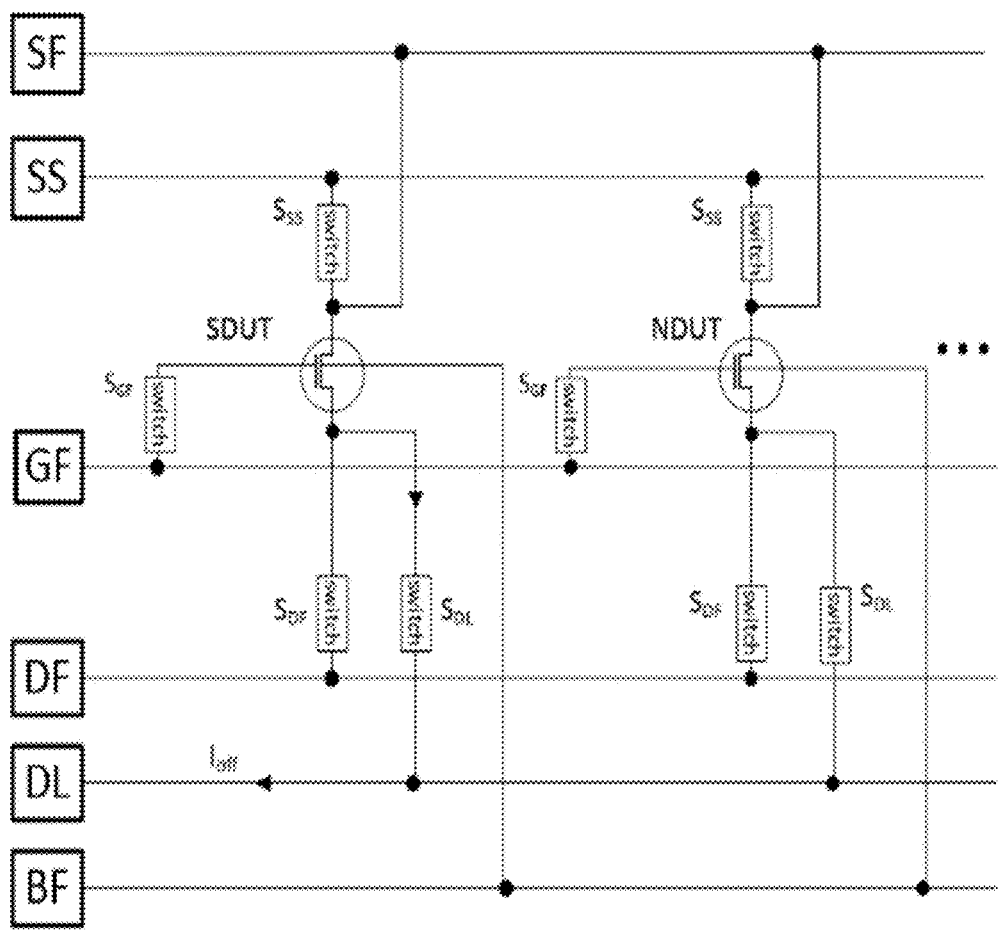
FIG. 9E is a circuit configuration diagram of when measuring $I_{off}$ according to some embodiments, which includes six test signal lines, and the subthreshold leakage current $I_{off}$ is measured at the DL end.

To measure subthreshold leakage current $I_{off}$ as shown in FIG. 9E. Closing switch $S_{DL}$, $S_{GF}$ which connected to the selected transistor and switch $S_{DF}$, $S_{SS}$ which connected to unselected transistors, in the same time, unclosing all other switches, so that, the selected transistor's D end is connecting to signal line DL, and the unselected transistors' D end to signal line DF, this will reduce the effect on measurement caused by unselected transistors' current leakage; at the same time, the supply voltage of DF end is equal to DL end's supply voltage, to make sure the both sides of switch $S_{DL}$ which connected to signal line DL of unselected transistors have no voltage drop, and reduce the effect on measurement caused by switch current leakage, the subthreshold leakage current $I_{off}$ is measured in DL end.

$I_{off}$ and $I_{dsat}$ are measured in different signal lines, switch $S_{DL}$ can reduce electric leakage caused by itself through adjusting its own size, so that, the increase of conduction resistance has no effect to measure $I_{dsat}$, wherein, switch $S_{DL}$ is NMOS. The thick-oxide device is choosing generally as switch circuit, but the substrate voltage is larger than general core device, even if there is no voltage drop between source end and drain end, there still has voltage drop between source end and substrate. The substrate's voltage of NMOS is GND, the voltage of source end and drain end of NMOS can be controlled as GND, therefore, NMOS has less current leakage than PMOS.

Saturation current $I_{dsat}$ and subthreshold leakage current $I_{off}$ are two important parameters to judge transistors' characters in nanometer process.

The measurement conditions of saturation current $I_{dsat}$ and subthreshold leakage current $I_{off}$ of NMOS and PMOS as shown in the following Table 1.

G/D/S/B respectively represent transistor's Gate, Drain, Source and substrate; VDD is working voltage of the transistor; GND is voltage of ground, generally is 0V; W, L respectively is the width and length of channel; $I_0$ is a constant depend to the process level of foundry.

TABLE 1

| | NMOS | PMOS |
|---|---|---|
| $I_{dast}$ | $V_G = V_D = $ VDD, $V_S = V_B = $ GND, Current of D end | $V_G = V_D = $ GND, $V_S = V_B = $ VDD, Current of D end |
| $I_{off}$ | $V_D = $ VDD, $V_G = V_S = V_B = $ GND, Current of D end | $V_D = $ GND, $V_G = V_S = V_B = $ VDD, Current of D end |

Example 2

Figure 10:
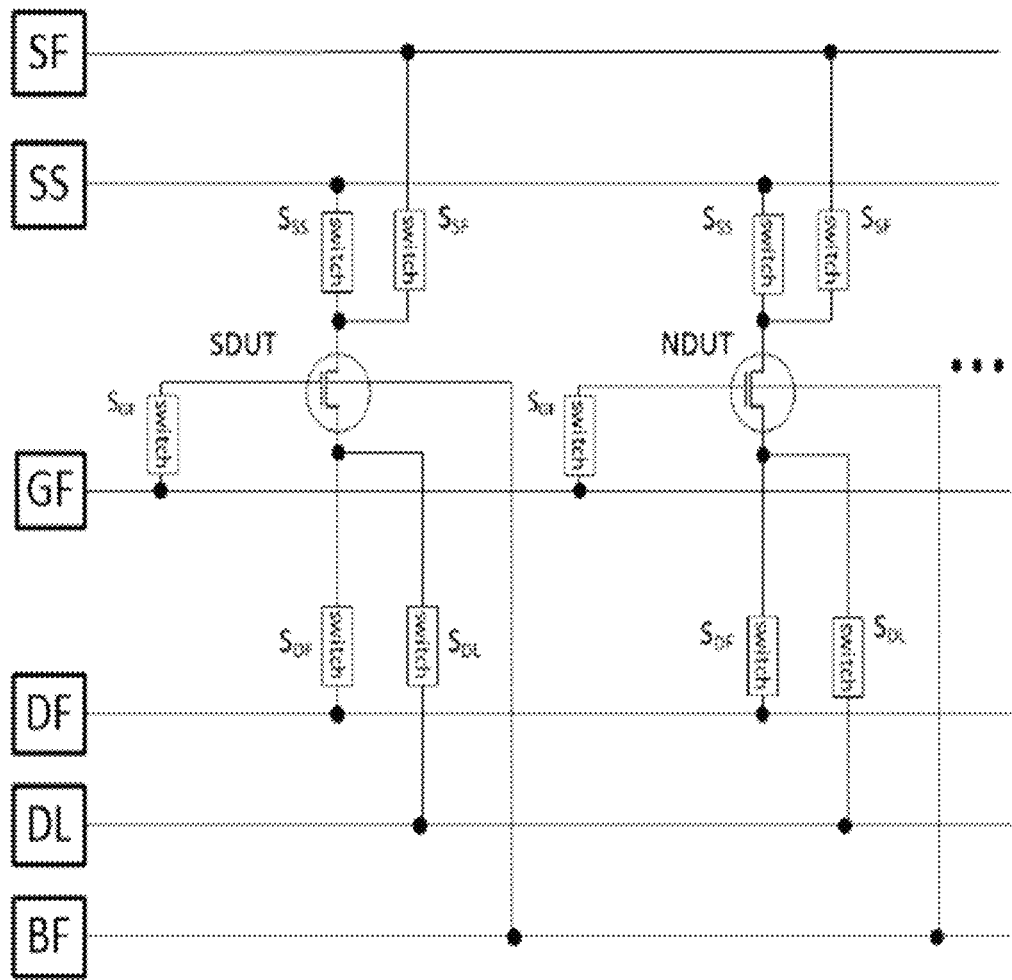
FIG. 10 is a circuit configuration diagram according to some embodiments, which includes six test signal lines, the saturation current $I_{dsat}$ is measured in the DF end the subthreshold leakage current $I_{off}$ is measured at the DL end.

Referring to FIG. 10, another circuit structure of a plurality of DUT Bits is shown: the S end of each transistor connects to test signal line SF and SS though switch $S_{SF}$ and $S_{SS}$, respectively; the D end of each transistor connects to test signal line DF and DL through switch $S_{DF}$ and $S_{DL}$, respectively; the G end of each transistor connects to test signal line GF though switch $S_{GF}$, the B end of each transistor connects to test signal line BF directly. Wherein, switch $S_{DL}$ is NMOS, and other switches are transmission gates or single MOS transistors; the state of all switches are controlled through switching control circuits which is decided by the selection signals, the selection signals are generated by addressable circuit, the addressable circuit and switching circuit belong to combinational logic circuits. By contrast, the S end of each transistor connect to test signal line SF directly in example 1. The subthreshold leakage current $I_{off}$ and saturation current $I_{dsat}$ are measured in different signal lines DL and DF, respectively.

The working principle of present embodiment as following: similar to example 1, selecting one of the transistors as the DUT through addressable circuit, and measuring its $I_{dsat}$ and $I_{off}$ respectively.

To measure saturation current $I_{dsat}$, closing switch $S_{DF}$, $S_{DL}$, $S_{SS}$, $S_{SF}$, $S_{GF}$ which connected to SDUT, in the same time, unclosing $S_{DF}$, $S_{DL}$, $S_{SS}$, $S_{SF}$, $S_{GF}$ which connected to NDUT, the D end of the selected transistor is applied voltage connection, the S end is induced voltage connection, and DF, SF are force ends, DL, SS are sense ends, giving a voltage to force ends, at the same time, the voltage of D/S end can be detected through the sense end to judge whether it meets the measurement conditions, if not, adjusting the applied voltage to eliminate bad effects on the measurement, the effects are arose from the drop voltage of conduction resistance and line resistance, the saturation current $I_{dsat}$ is measured in DF end.

To measure subthreshold leakage current $I_{off}$, closing switch $S_{DL}$, $S_{SF}$, $S_{GF}$ which connected to the selected transistor and switch $S_{DF}$, $S_{SS}$ which connected to unselected transistors, in the same time, unclosing $S_{DF}$, $S_{SS}$ which connected to the selected transistor and switch $S_{DL}$, $S_{SF}$, $S_{GF}$ which connected to unselected transistors, connecting the selected transistor's D end to signal line DL, and the unselected transistors' D end to signal line DF, this will reduce the effect on measurement caused by unselected transistors' electric leakage; at the same time, the supply voltage of DF end is equal to DL end's supply voltage, to make sure the both sides of switch $S_{DL}$ which connect to signal line DL of unselected transistor have no voltage drop, and reduce the effect caused by switch electric leakage on measurement, the subthreshold leakage current $I_{off}$ is measured in DL end.

Switches can be a transmission gate or a single transistor.

Example 3

Figure 11:
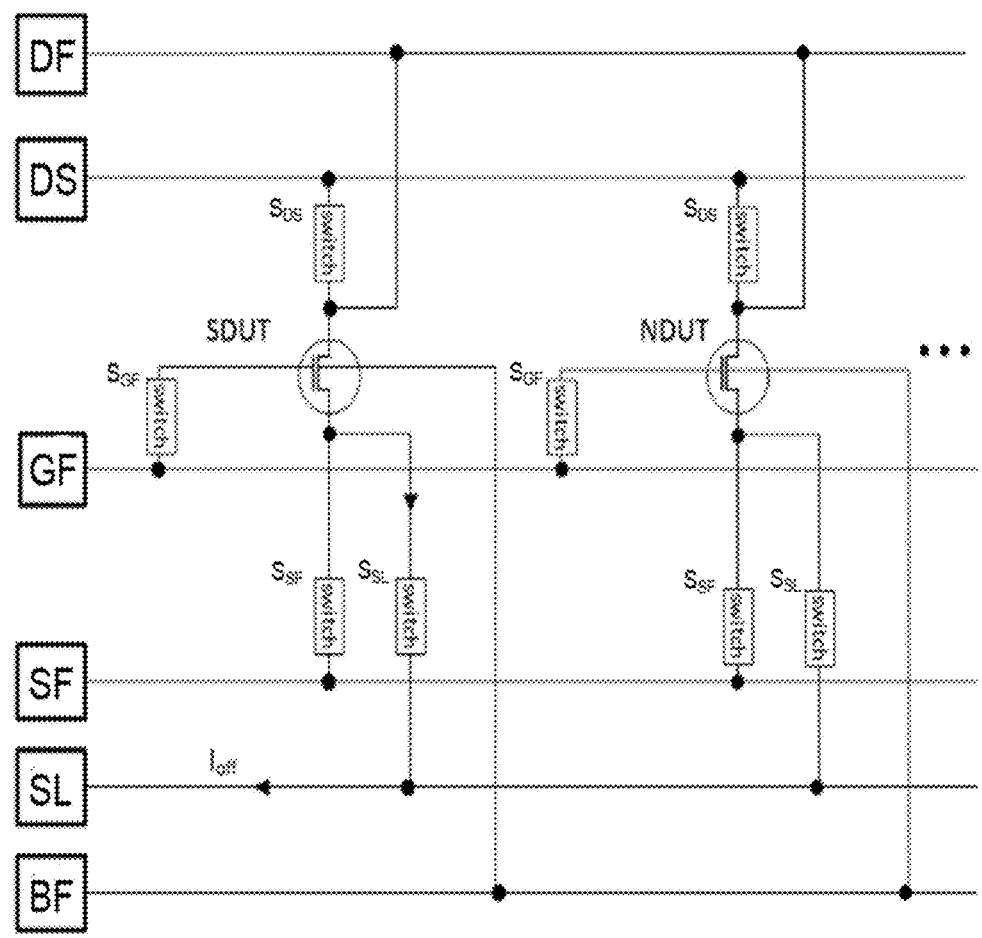
FIG. 11 is a circuit configuration diagram according to some embodiments, which includes six test signal lines, different to FIG. 9A and FIG. 9B, the S end and D end is interchanged; the saturation current $I_{dsat}$ is measured in SF end the subthreshold leakage current $I_{off}$ is measured at the DL end.

Referring to FIG. 11, another circuit structure of a plurality of DUT Bits is shown: the S end of each transistor connects to test signal line SF and SL though switch $S_{SF}$ and $S_{SL}$ respectively; the D end of each transistor connects to test signal line DF through switch $S_{DF}$, and connects to test signal line DS directly; the G end of each transistor connects to test signal line GF though switch $S_{GF}$, the B end of each transistor connects to test signal line BF directly. Wherein, switch $S_{SL}$ is NMOS, and other switches are transmission gates or single MOS transistors. The states of all switches are controlled through switching control circuits which are decided by the selection signals, the selection signals are generated by the addressable circuit, the addressable circuit and the switching circuit belong to the combinational logic circuit. By contrast, the S end of each transistor connect to test signal line SF directly in example 1. Different from example 1, the S end and D end is interchanged. The subthreshold leakage current $I_{off}$ and saturation current $I_{dsat}$ are measured in different signal lines SF and SL, respectively.

The working principle of present example as following: similar to example 1, selecting one of the transistors as the DUT through addressable circuit, and measure its $I_{dsat}$ and $I_{off}$ respectively.

To measure saturation current $I_{dsat}$, closing switch $S_{SL}$, $S_{DS}$, $S_{GF}$, $S_{SF}$, which connected to SDUT, in the same time, unclosing $S_{SF}$, $S_{SL}$, $S_{DS}$, $S_{GF}$ which connected to NDUT, the D end of the selected transistor is applied voltage connection, the S end is induced voltage connection, and DF,SF are force ends, SL, DS are sense ends, giving a voltage to force ends, at the same time, the voltage of D/S end can be detected through the sense end to judge whether it meets the measurement conditions, if not, adjusting the applied voltage to eliminate bad effects on the measurement, the said effects are arose from the drop voltage of conduction resistance and line resistance. The saturation current $I_{dsat}$ is measured in the SF end.

To measure subthreshold leakage current $I_{off}$, closing switches $S_{GF}$, $S_{SL}$ which connected to the selected transistor and switch $S_{SF}$, $S_{DS}$ which connected to unselected transistors, in the same time, unclosing $S_{SF}$, $S_{DS}$ which connected to the selected transistor and switches $S_{FG}$, $S_{SL}$ which connected to unselected transistor, connecting the selected transistor's S end to signal line SL, and the unselected transistors' S end to signal line SF, this method can reduce the effect on measurement caused by unselected transistors' electric leakage; at the same time, the supply voltage of SF end is equal to SL end's supply voltage, to make sure the both sides of switch $S_{SL}$ of unselected transistor which connect to signal line SL have no voltage drop, and reduce the effect on measurement caused by switch electric leakage. The subthreshold leakage current $I_{off}$ is measured in the SL end.

Example 4

There are many other electrical parameters of transistor besides saturation current and sub-threshold leakage current, when it comes to need measurement of electric parameters of G end, such as leakage current of G end, the method of setting two signal lines GF and GL on the G end is common, GL is sense voltage signal line, it senses the voltage of G end to adjust the voltage drop pass by switch.

Figure 12:
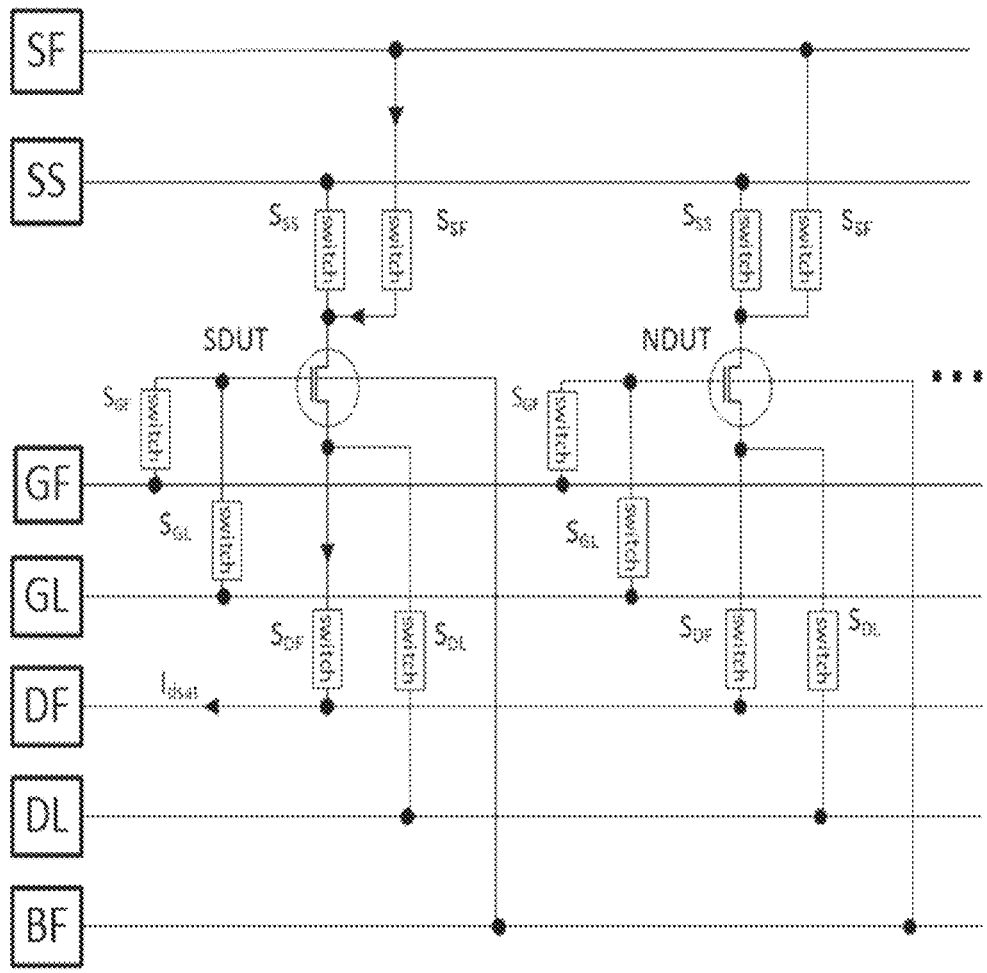
FIG. 12 is a circuit configuration diagram according to some embodiments, which includes seven test signal lines, the saturation current $I_{dsat}$ is measured in DF end the subthreshold leakage current $I_{off}$ is measured at the DL end.

According to some embodiments, another circuit structure of a plurality of DUT Bits is shown in FIG. 12: the S end of each transistor connects to test signal line SF and SS though switch $S_{SF}$ and $S_{SS}$ respectively, the D end of each transistor connects to test signal line DF and DL through switch $S_{DF}$ and $S_{DL}$ respectively, the G end of each transistor connects to test signal line GF and GL though switch $S_{GF}$ and $S_{GL}$ respectively, the B end of each transistor connects to test signal line BF directly.

Wherein, switch $S_{DL}$ is NMOS, and other switches are transmission gates or single MOS transistors; the state of all switches are controlled through switching control circuits which are decided by the selection signals, the selection signals are generated by addressable circuit, the addressable circuit and the switching circuit belong to the combinational logic circuit. The subthreshold leakage current $I_{off}$ and saturation current $I_{dsat}$ are measured in different signal lines DF and DL respectively.

To measure the saturation current $I_{dsat}$, closing switches $S_{SS}$, $S_{DF}$, $S_{DL}$, $S_{GF}$, $S_{SF}$, which connect to SDUT and switch $S_{GL}$ which connect to NDUT, in the same time, unclosing $S_{SS}$, $S_{DF}$, $S_{DL}$, $S_{GF}$ which connect to NDUT and switch $S_{GL}$ which connect to SDUT. The saturation current $I_{dsat}$ is measured in the DF end.

To measure subthreshold leakage current $I_{off}$, closing switch $S_{SS}$, $S_{DF}$, $S_{DL}$, $S_{GF}$ which connected to the selected transistor and switches $S_{SF}$, $S_{DF}$, $S_{GL}$ which are connected to unselected transistors, in the same time, unclosing $S_{SS}$, $S_{DL}$, $S_{GL}$ which are connected to the selected transistor and switches $S_{GL}$, $S_{DF}$ which are connected to unselected transistor. The subthreshold leakage current $I_{off}$ is measured in the DL end.

All references cited herein are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An addressable test circuit configured to test parameters of devices under test (DUTs) selected from a plurality of transistors, the addressable test circuit comprising:
   a combination logic circuit configured to select a DUT from the plurality of the transistors, the combination logic circuit comprising:
   an addressing circuit including:
     a row addressing circuit configured to select a row of transistors; and
     a column addressing circuit configured to select a column of transistors; and
       a switching circuit including a plurality of switching control circuits and a plurality of switches, wherein states of the plurality of switches are controlled by the plurality of switching control circuits;
   a plurality of PADs including signal PADs and address PADs;
   a plurality of address buses and a plurality of data buses, wherein at least six of the plurality of data buses are test signal lines;

wherein:
a plurality of inputs of the addressing circuit are coupled to the plurality of address PADs,
a plurality of outputs of the addressing circuit are coupled to the switching circuit through the plurality of address buses,
the switching circuit is coupled to the signal PADs and the DUTs, and
the DUTs are coupled to the plurality of PADs through the plurality of data buses.

2. The addressable test circuit of claim 1, wherein at least seven of the plurality of data buses are test signal lines.

3. The addressable test circuit of claim 2, wherein:
each transistor has Source (S) end, Drain (D) end, Gate (G) end and Substrate (B) end,
the S end of each transistor is connected to a first test signal line SF of the test signal lines, and to a second test signal line SS of the test signal lines through a first switch $S_{SS}$ of the plurality of switches;
the D end of each transistor is connected to a third test signal line DF of the test signal lines through a second switch $S_{DF}$ of the plurality of switches and to a fourth test signal line DL of the test signal lines through a third switch $S_{DL}$ of the plurality of switches;
the G end of each transistor is connected to a fifth test signal line GF of the test signal lines through a fourth switch $S_{GF}$ of the plurality of switches;
the B end of each transistor is connected a sixth test signal line BF of the test signal lines; and
the S end and D end are interchangeable.

4. The addressable test circuit of claim 3, wherein:
in a case that the DUT is a PMOS,
the addressable test circuit is configured to have states for a saturation current $I_{dsat}$ of the DUT to be measured by current measurement equipment, wherein the states for the saturation current measurement include that:
the gate end G and the drain end D are connected to a supply voltage VDD,
the source end S and a substrate B are connected to a ground GND; and
the addressable test circuit is configurable for a leakage current $I_{off}$ of the DUT to be measured by current measurement equipment, wherein the states for the leakage current measurement include that:
the drain end D is connected to the supply voltage VDD, and
the source end S, the gate end G, and the substrate B are connected to the ground GND.

5. The addressable test circuit of claim 3, wherein the S end of each transistor is configured to be connected to the first test signal line SF through a switch $S_{SF}$ of the plurality of switches.

6. The addressable test circuit of claim 3, wherein the plurality of switches in the addressable test circuit are transmission gates or single transistors.

7. The addressable test circuit of claim 3, wherein the third switch $S_{DL}$ comprises an NMOS to thereby reduce electric leakage.

8. The addressable test circuit of claim 3, wherein the row and column addressing circuits of the addressable test circuit is configured to select a DUT, and the plurality of switching control circuits are configured to control switches in on-state or off-state to test different parameters.

9. The addressable test circuit of claim 3, wherein a saturation current $I_{dsat}$ and a subthreshold leakage current $I_{off}$ are measured in the third test signal line DF, and the fourth test signal line DL, respectively.

10. The addressable test circuit of claim 3, wherein each G end of each transistor is configured to be connected to a seventh signal line via a switch $S_{GL}$ of the plurality of switches.

11. The addressable test circuit of claim 10, wherein, to measure a saturation current $I_{dsat}$ and a sub-threshold leakage current $I_{off}$, the switch $S_{GL}$ in the seventh signal line connected to the DUT is open, and the switch $S_{GL}$ in the seventh signal line connected to a transistor not under test among the plurality of transistors is closed.

12. The addressable test circuit of claim 3, wherein:
in a case that the DUT is an NMOS,
the addressable test circuit is configured to have states for a saturation current $I_{dsat}$ of the DUT to be measured by current measurement equipment, wherein the states for the saturation current measurement include that:
the gate end G and the drain end D are connected to a supply voltage VDD,
the source end S and a substrate B are connected to a ground GND; and
the addressable test circuit is configured to have states for a leakage current $I_{off}$ of the DUT to be measured by current measurement equipment, wherein the states for the leakage current measurement include that:
the drain end D is connected to the supply voltage VDD, and
the source end S, the gate end G, and the substrate B are connected to the ground GND.

13. A test method for testing parameters of devices under test (DUTs) selected from a plurality of transistors using an addressable test circuit including:
a combination logic circuit configured to select the DUTs and control switches' states, the combination logic circuit comprising an addressing circuit and a switching circuit, the addressing circuit including a row addressing circuit configured to select a row of transistors and a column addressing circuit configured to select a column of transistors, the switching circuit including a plurality of switching control circuits and a plurality of switches, wherein states of the plurality of switches are controlled by the plurality of switching control circuits;
a plurality of PADs including a plurality of address PADs and test/signal PADs;
a plurality of address buses and data buses, wherein six or seven of the data buses are test signal lines;
a plurality of inputs of the addressing circuit are coupled to the plurality of address PADs, a plurality of outputs of the addressing circuit are coupled to the switching circuit through the data buses, the switching circuit is coupled to the signal PADs and the DUTs, the DUTs are coupled to the test PADs through the test signal lines;
each transistor has a Source (S) end, a Drain (D) end, a Gate (G) end, and a Substrate (B) end, the S end of each transistor is connected to a first test signal line SF of the test signal lines directly or through a switch $S_{SF}$ of the plurality of switches, and via a first switch $S_{SS}$ of the plurality of switches connected to a second test signal line SS of the test signal lines; the D end of each transistor is connected to a third and fourth test signal lines DF, DL of the test signal lines through a second switch $S_{DF}$ and a third switch $S_{DL}$ of the plurality of switches, respectively; the G end of each transistor is connected to a fifth test signal lines GF of the test signal lines through a fourth switch $S_{GF}$ of the plurality of switches; the B end of each transistor is connected to a sixth test signal line BF of the test signal lines;

the method comprising:
the addressing circuit selecting the DUTs among the plurality of transistors with select signals input to the switching control circuits to control the switches' states: closing the switches $S_{DF}$, $S_{DL}$, $S_{SS}$, $S_{GF}$, which connect to the DUTs, while unclosing other switches, a saturation current $I_{dsat}$ is measured in the third test signal line DF;
the addressing circuit selecting the DUTs among the plurality of transistors with select signals input to the switching control circuits to control the switches' states: closing the switches $S_{DL}$, $S_{GF}$, which connect to the DUTs and the switches $S_{DF}$, $S_{SS}$ which connect to those unselected transistors, while unclosing other switches, equalizing a source voltage at signal lines DF and DL, a subthreshold leakage current $I_{off}$ is measured in the fourth test signal line DL.

14. The test method of claim 13, wherein:
when the saturation current $I_{dsat}$ is measured, the DL signal line of the DUT is configured to sense;
force and sense voltage connections are disposed between the DF and DL test signal lines at the D end, the SF and SS signal lines at the end;
applying a voltage to D/S end through DF/SF, the voltage of D/S can be detected through induced voltage end DL/SS to judge whether it meets measurement conditions, if not, adjusting the applied voltage.

15. The test method of claim 13, wherein when the subthreshold leakage current $I_{off}$ is measured, applying a voltage to the DL end, the voltage applied to DL end is equal to the voltage of DF end to thereby improve test accuracy of $I_{off}$ due to voltage drop.

16. A circuit testing system comprising:
a plurality of transistors to be tested; and
an addressable test circuit configured to test parameters of the plurality of transistors, the addressable test circuit comprising:
a combination logic circuit configured to select devices under test (DUTs) from the plurality of transistors, the combination logic circuit comprising:
an addressing circuit including:
a row addressing circuit configured to select a row of transistors; and
a column addressing circuit configured to select a column of transistors; and
a switching circuit including a plurality of switching control circuits and a plurality of switches, wherein states of the plurality of switches are controlled by the combination logic circuit;
a plurality of PADs including a plurality of signal PADs and a plurality of address PADs;
a plurality of address buses and a plurality of data buses, wherein at least six of the plurality of data buses are test signal lines;
wherein:
a plurality of inputs of the addressing circuit are coupled to the plurality of address PADs,
a plurality of outputs of the addressing circuit are coupled to the switching circuit through the plurality of address buses,
the switching circuit is coupled to the plurality of signal PADs and the DUTs, and
the DUTs are coupled to the plurality of PADs through the plurality of data buses.

17. The system of claim 16, wherein at least seven of the plurality of data buses are test signal lines.

18. The system of claim 17, wherein:
each transistor has a Source (S) end, a Drain (D) end, a Gate (G) end, and a Substrate (B end), the S end of each transistor is connected to a first test signal line of the test signal lines, and to a second test signal line of the test signal lines through a first switch $S_{SS}$ of the plurality of switches;
the D end of each transistor is connected to a third test signal line of the test signal lines through a second switch $S_{DF}$ of the plurality of switches and to a fourth test signal line of the test signal lines through a third switch $S_{DL}$ of the plurality of switches;
the G end of each transistor is connected to a fifth test signal line of the test signal lines through a fourth switch $S_{GF}$ of the plurality of switches;
the B end of each transistor is connected a sixth test signal line of the test signal lines; and
the S end and D end are interchangeable.

19. The system of claim 18, wherein:
the S end of each transistor is connected to a first test signal line SF, and via the first switch $S_{SS}$ connected to a second test signal line SS;
the D end of each transistor is connected to a third and a fourth test signal lines DF, DL through the second switch $S_{DF}$ and a third switch $S_{DL}$, respectively;
the G end of each transistor is connected to a fifth test signal lines GF through the fourth switch $S_{GF}$; and
the B end of each transistor is connected to a sixth test signal line BF.

* * * * *